United States Patent
Hennedy et al.

(10) Patent No.: US 7,415,542 B2
(45) Date of Patent: Aug. 19, 2008

(54) MICRO-PROGRAMMABLE FILTER ENGINE HAVING PLURALITY OF FILTER ELEMENTS INTERCONNECTED IN CHAIN CONFIGURATION WHEREIN ENGINE SUPPORTS MULTIPLE FILTERS FROM FILTER ELEMENTS

(75) Inventors: Michael Hennedy, Holmdel, NJ (US); Vladimir Friedman, Scotch Plains, NJ (US); Artemas Speziale, Hazlet, NJ (US); Mohammad Reza Sherkat, Hillsborough, NJ (US)

(73) Assignee: Analog Devices, Inc., Norwood, MA (US)

( * ) Notice: Subject to any disclaimer, the term of this patent is extended or adjusted under 35 U.S.C. 154(b) by 496 days.

(21) Appl. No.: 10/871,509

(22) Filed: Jun. 18, 2004

(65) Prior Publication Data
US 2005/0283509 A1    Dec. 22, 2005

(51) Int. Cl.
*G06F 3/00* (2006.01)
*G06F 7/38* (2006.01)
*G06F 17/10* (2006.01)

(52) U.S. Cl. .................. 710/1; 708/300; 708/320; 708/603; 708/622; 709/205; 710/3

(58) Field of Classification Search ................. 708/300, 708/320, 603, 622; 709/205; 710/1, 3
See application file for complete search history.

(56) References Cited

U.S. PATENT DOCUMENTS

| | | | |
|---|---|---|---|
| 5,243,551 A | 9/1993 | Knowles et al. | 708/603 |
| 5,432,723 A | 7/1995 | Chen et al. | 708/300 |
| 6,263,354 B1 | 7/2001 | Gandhi | 708/320 |
| 6,279,019 B1 | 8/2001 | Oh et al. | 708/300 |
| 6,314,393 B1 | 11/2001 | Zheng et al. | 704/223 |
| 6,823,353 B2 * | 11/2004 | Fischer et al. | 708/622 |
| 6,952,709 B1 * | 10/2005 | Dujardin et al. | 708/300 |
| 2002/0161806 A1 * | 10/2002 | Shaikh | 708/300 |
| 2004/0101039 A1 * | 5/2004 | Glendenning | 375/232 |
| 2004/0181564 A1 | 9/2004 | MacInnis et al. | 708/322 |
| 2005/0251542 A1 * | 11/2005 | Hennedy et al. | 708/300 |

\* cited by examiner

*Primary Examiner*—Tammara Peyton
(74) *Attorney, Agent, or Firm*—Bromberg & Sunstein LLP

(57) ABSTRACT

A micro-programmable filter (MFE) engine includes multiple programmable filter elements and a microcode controller. The filter elements can be configured, controlled, and combined in different ways to implement different types of filters. The MFE preferably supports multiple-execution instructions that allow a single instruction to perform multiple moves into accumulators for efficient data movement inside MFE.

50 Claims, 21 Drawing Sheets

MICRO-PROGRAMMABLE FILTER ENGINE HAVING PLURALITY OF FILTER ELEMENTS INTERCONNECTED IN CHAIN CONFIGURATION WHEREIN ENGINE SUPPORTS MULTIPLE FILTERS FROM FILTER ELEMENTS

CROSS-REFERENCE TO RELATED APPLICATION(S)

The present application may be related to the following commonly owned U.S. patent applications, which were filed on even date herewith and are hereby incorporated herein by reference in their entireties:

U.S. patent application Ser. No. 10/871,794 entitled DIGITAL FILTER USING MEMORY TO EMULATE A VARIABLE SHIFT REGISTER; and U.S. patent application Ser. No. 10/871,411 entitled MICRO-PROGRAMMABLE DIGITAL FILTER.

FIELD OF THE INVENTION

The present invention relates generally to communication systems, and more particularly to a micro-programmable filter engine having multiple programmable filter elements that can be configured, controlled, and combined in different ways to implement different types of filters.

BACKGROUND OF THE INVENTION

Certain communication devices transmit and receive signals over a communication medium, such as a wireline, wireless, or optical communication medium. These communication devices typically include digital filters for performing various filtering operations, such as Finite Impulse Response (FIR) filtering, Infinite Impulse Response (IIR) filtering, decimation, interpolation, and echo cancellation. The types and configurations of digital filters (e.g., the number of taps or bi-quads) for a particular implementation are typically selected based on the type of communication system and the expected characteristics of the communication medium. Often, the types and configurations of digital filters selected for a particular implementation are trade-offs to obtain acceptable performance over a range of possible conditions.

SUMMARY OF THE INVENTION

A micro-programmable filter engine (MFE) provides a flexible and programmable digital filter architecture for implementing various digital filters in hardware in a communication device. The MFE includes multiple programmable filter elements and a microcode controller. The filter elements can be configured, controlled, and combined in different ways to implement different types of filters. The MFE preferably supports multiple-execution instructions that allow a single instruction to perform multiple moves into accumulators for efficient data movement inside MFE.

In one aspect of the invention, there is provided a micro-programmable filter engine having a first plurality of programmable filter elements, at least one of which including a first microcode control program for internal control of the programmable filter element. The micro-programmable filter engine also has programmable interconnection logic coupled to the programmable filter elements for selectively combining, scaling, and accumulating output values received from the programmable filter elements and selectively providing accumulated values as inputs to the programmable filter elements. The micro-programmable filter engine also has a filter controller coupled to the programmable filter elements and the programmable interconnection logic. The filter controller has a second microcode control program for external control of the programmable filter elements and the programmable interconnection logic.

The filter controller may include an instruction memory for storing the second control program and at least one instruction decoder coupled to the instruction memory for programming the programmable filter elements and the programmable interconnection logic based on the second control program. The filter controller may include a plurality of program counters for running different iterations of the second control program for different filter elements. The filter controller may include a plurality of loop counters for running different iterations of second control program loops for different filter elements.

The programmable interconnection logic may include a multiplexer coupled to the first plurality of programmable filter elements for selectively driving output values received from the first plurality of programmable filter elements, a barrel shifter coupled to the multiplexer for receiving the values and selectively scaling the values according to a scaling factor programmed by the first filter controller, and at least one accumulator coupled to the barrel shifter for selectively accumulating scaled values from the barrel shifter. The programmable interconnection logic may further include programmable feedback logic coupled to the at least one accumulator and to the filter elements for selectively providing the accumulated values as inputs to the programmable filter elements.

At least one programmable filter element having a first microcode control program may include its own plurality of programmable filter elements, programmable interconnection logic, and filter controller. This filter controller controls the programmable filter elements and the programmable interconnection logic according to the first control program.

At least one programmable filter element may include at least one memory for storing data samples and coefficients, a multiplier for multiplying data samples read from the at least one memory with corresponding coefficients read from the at least one memory, an accumulator for summing multiplier outputs, and control logic for controlling the at least one memory, the multiplier, and the accumulator. The control logic logically shifts the data samples read from the at least one memory and writes the logically shifted data samples back into the at least one memory so as to emulate a shift register.

Within the micro-programmable filter engine, the filter controller may allow each programmable filter element to operate independently to perform different filtering functions. Alternatively, the micro-programmable filter engine may allow operation of multiple programmable filter elements to be combined to perform a single filtering function. The filter controller can implement a plurality of filters, each having a symbol rate, and the repetitive execution, by the first filter controller, of a loop containing a number of single-clock instructions can be completed in the number of clocks that are required for execution of a symbol for the filter having the slowest symbol rate. During each symbol period of the slowest symbol rate filter, filters with faster symbol rates than the slowest symbol rate filter can operate on multiple symbols. Also during each symbol period of the slowest symbol rate filter, filters with faster symbol rates than the slowest symbol rate filter can complete execution of a symbol and then remain idle for the remainder of the symbol period.

The filter controller has a set of microcode instructions that can be used to control the filter elements and the programmable interconnection logic. Each microcode instruction may contain a clock field that is used by the filter controller to apply software-generated clocks to the individual filter elements. A software-controlled clock may be generated by programming a value of one or zero in the clock field in each microcode instruction, such that the sequence of ones and zeros directly generate a plurality of symbol clocks at a frequency dictated by the sequence and the length of instruction loop. Symbol clocks applied to the plurality of filter elements may be dynamically selected via software and the frequencies may be determined by a field in the instruction set. Each microcode instruction may contain a loop evaluation bit that is evaluated by the filter controller during the execution of each instruction.

In another aspect of the invention, there is provided apparatus for digital filtering including a plurality of programmable filter elements, at least one of which including a first microcode control program for internal control of the programmable filter element. The apparatus also includes first means for programming the first plurality of programmable filter elements based on a second microcode control program and first means for selectively combining, scaling, and accumulating output values received from the first plurality of programmable filter elements and for selectively providing accumulated values as inputs to the first plurality of programmable filter elements.

The first means for programming the first plurality of programmable filter elements based on a second microcode control program may include an instruction memory for storing the second control program and means for decoding the second control program for programming the first plurality of programmable filter elements and the first programmable interconnection logic based on the second control program. The first means for programming the first plurality of programmable filter elements based on a second microcode control program may include means for running different iterations of the second control program for different filter elements. Alternatively, the first means for programming the first plurality of programmable filter elements based on a second microcode control program may include means for running different iterations of second control program loops for different filter elements.

The first means for selectively combining, scaling, and accumulating output values received from the first plurality of programmable filter elements and for selectively providing accumulated values as inputs to the first plurality of programmable filter elements may include means for selectively outputting values received from the first plurality of programmable filter elements, means for receiving the outputted values and selectively scaling the outputted values according to a pre-programmed scaling factor, and means for selectively accumulating scaled values. The first means for selectively combining, scaling, and accumulating output values received from the first plurality of programmable filter elements and for selectively providing accumulated values as inputs to the first plurality of programmable filter elements may also include means for selectively providing the accumulated values as inputs to the first plurality of programmable filter units.

At least one programmable filter element having a first microcode control program may include a second plurality of programmable filter elements, second means for programming the second plurality of programmable filter elements based on the first microcode control program, and second means selectively combining, scaling, and accumulating output values received from the second plurality of programmable filter elements and selectively providing accumulated values as inputs to the second plurality of programmable filter elements.

At least one of the first plurality of programmable filter elements may include at least one memory for storing data samples and coefficients, means for combining data samples read from the at least one memory with corresponding coefficients read from the at least one memory, and means for logically shifting the data samples read from the at least one memory and writing the logically shifted data samples back into the at least one memory so as to emulate a shift register.

The first means for programming the first plurality of programmable filter elements based on a second microcode control program may include means for each programmable filter element to operate independently to perform different filtering functions. Alternatively, the first means for programming the first plurality of programmable filter elements based on a second microcode control program may include means for allowing operation of multiple programmable filter elements to be combined to perform a single filtering function.

The first means for programming the first plurality of programmable filter elements may include means for implementing a plurality of filters, each having a symbol rate, wherein the repetitive execution of a loop containing a number of single-clock instructions can be completed in the number of clocks that are required for execution of a symbol for the filter having the slowest symbol rate. The means for implementing a plurality of filters may include means for operating on multiple symbols, during each symbol period of the slowest symbol rate filter, for filters with faster symbol rates than the slowest symbol rate filter. The means for implementing a plurality of filters may include means for completing execution of a symbol and then remaining idle for the remainder of the symbol period, during each symbol period of the slowest symbol rate filter, for filters with faster symbol rates than the slowest symbol rate filter.

The first means for programming the first plurality of programmable filter elements may include means for applying software-generated clocks to the individual filter elements based on a clock field in each microcode instruction. A software-controlled clock may be generated by programming a value of one or zero in the clock field in each microcode instruction, such that the sequence of ones and zeros directly generate a plurality of symbol clocks at a frequency dictated by the sequence and the length of instruction loop. The symbol clocks applied to the plurality of filter elements may be dynamically selected via software and the frequencies may be determined by a field in the instruction set. Each microcode instruction may contain a loop evaluation bit that is evaluated during the execution of each instruction.

In another aspect of the invention, there is provided a communication device including a transceiver for transmitting and receiving communication signals and a micro-programmable filter engine in communication with the transceiver for processing digitized data samples corresponding to the communication signals. The micro-programmable filter engine has a first plurality of programmable filter elements, at least one of which including a first microcode control program for internal control of the programmable filter element. The micro-programmable filter engine also has programmable interconnection logic coupled to the programmable filter elements for selectively combining, scaling, and accumulating output values received from the programmable filter elements and selectively providing accumulated values as inputs to the programmable filter elements. The micro-programmable filter engine also has a filter controller coupled to the programmable filter elements and the programmable interconnection logic. The filter controller has a second microcode control program for external control of the programmable filter elements and the programmable interconnection logic.

The filter controller may include an instruction memory for storing the second control program and at least one instruction decoder coupled to the instruction memory for programming the programmable filter elements and the programmable interconnection logic based on the second control program. The filter controller may include a plurality of program counters for running different iterations of the second control program for different filter elements. The filter controller may include a plurality of loop counters for running different iterations of second control program loops for different filter elements.

The programmable interconnection logic may include a multiplexer coupled to the first plurality of programmable filter elements for selectively driving output values received from the first plurality of programmable filter elements, a barrel shifter coupled to the multiplexer for receiving the values and selectively scaling the values according to a scaling factor programmed by the first filter controller, and at least one accumulator coupled to the barrel shifter for selectively accumulating scaled values from the barrel shifter. The programmable interconnection logic may further include programmable feedback logic coupled to the at least one accumulator and to the filter elements for selectively providing the accumulated values as inputs to the programmable filter elements.

At least one programmable filter element having a first microcode control program may include its own plurality of programmable filter elements, programmable interconnection logic, and filter controller. This filter controller controls the programmable filter elements and the programmable interconnection logic according to the first control program.

At least one programmable filter element may include at least one memory for storing data samples and coefficients, a multiplier for multiplying data samples read from the at least one memory with corresponding coefficients read from the at least one memory, an accumulator for summing multiplier outputs, and control logic for controlling the at least one memory, the multiplier, and the accumulator. The control logic logically shifts the data samples read from the at least one memory and writes the logically shifted data samples back into the at least one memory so as to emulate a shift register.

Within the micro-programmable filter engine, the filter controller may allow each programmable filter element to operate independently to perform different filtering functions. Alternatively, the micro-programmable filter engine may allow operation of multiple programmable filter elements to be combined to perform a single filtering function. The filter controller can implement a plurality of filters, each having a symbol rate, and the repetitive execution, by the first filter controller, of a loop containing a number of single-clock instructions can be completed in the number of clocks that are required for execution of a symbol for the filter having the slowest symbol rate. During each symbol period of the slowest symbol rate filter, filters with faster symbol rates than the slowest symbol rate filter can operate on multiple symbols. Also during each symbol period of the slowest symbol rate filter, filters with faster symbol rates than the slowest symbol rate filter can complete execution of a symbol and then remain idle for the remainder of the symbol period.

The filter controller has a set of microcode instructions that can be used to control the filter elements and the programmable interconnection logic. Each microcode instruction may contain a clock field that is used by the filter controller to apply software-generated clocks to the individual filter elements. A software-controlled clock may be generated by programming a value of one or zero in the clock field in each microcode instruction, such that the sequence of ones and zeros directly generate a plurality of symbol clocks at a frequency dictated by the sequence and the length of instruction loop. Symbol clocks applied to the plurality of filter elements may be dynamically selected via software and the frequencies may be determined by a field in the instruction set. Each microcode instruction may contain a loop evaluation bit that is evaluated by the filter controller during the execution of each instruction.

a first plurality of programmable filter elements, at least one of said first plurality of programmable filter elements having a first microcode control program for internal control of the programmable filter element;

first programmable interconnection logic coupled to the first plurality of programmable filter elements for selectively combining, scaling, and accumulating output values received from the first plurality of programmable filter elements and selectively providing accumulated values as inputs to the first plurality of programmable filter elements; and a first filter controller coupled to the first plurality of programmable filter elements and the first programmable interconnection logic, the first filter controller having a second microcode control program for external control of the first plurality of programmable filter elements and the first programmable interconnection logic.

DETAILED DESCRIPTION OF A PREFERRED EMBODIMENT

A micro-programmable filter engine (MFE) provides a flexible and programmable digital filter architecture for implementing various digital filters in hardware in a communication device. The MFE includes multiple programmable filter elements and a microcode controller. The filter elements can be configured, controlled, and combined in different ways to implement different types of filters. The MFE preferably supports multiple-execution instructions that allow a single instruction to perform multiple moves into accumulators for efficient data movement inside MFE. Various aspects of the present invention are described herein with reference to embodiments for a digital subscriber line (DSL) modem application, although the present invention is in no way limited to such an application, and various embodiments of the present invention can be used in other types of communication devices and applications.

Figure 1:
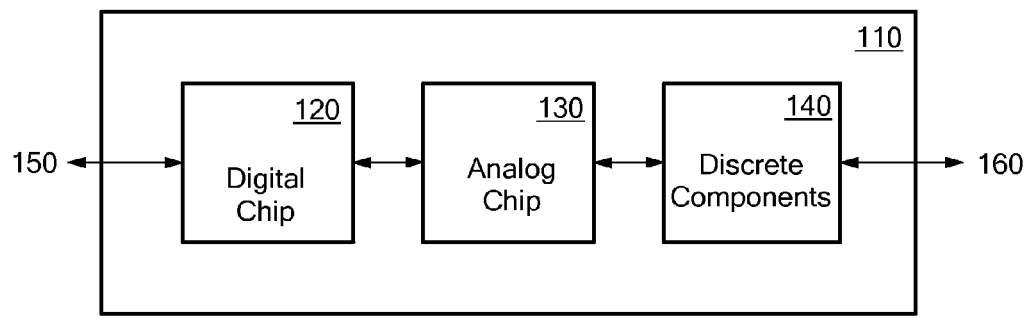
FIG. 1 is a block diagram showing the relevant components of a digital subscriber line modem in accordance with an embodiment of the present invention.

FIG. 1 is a block diagram 100 showing the relevant components of a DSL modem 110 in accordance with an embodiment of the present invention. Generally speaking, the DSL modem 110 has an interface to a phone line 160 and an interface to a computer 150, such as a USB interface, an Ethernet interface, or a PCI interface. Among other things, the DSL modem 110 typically includes a digital chip 120, an analog chip 130, and discrete components 140.

Figure 2:
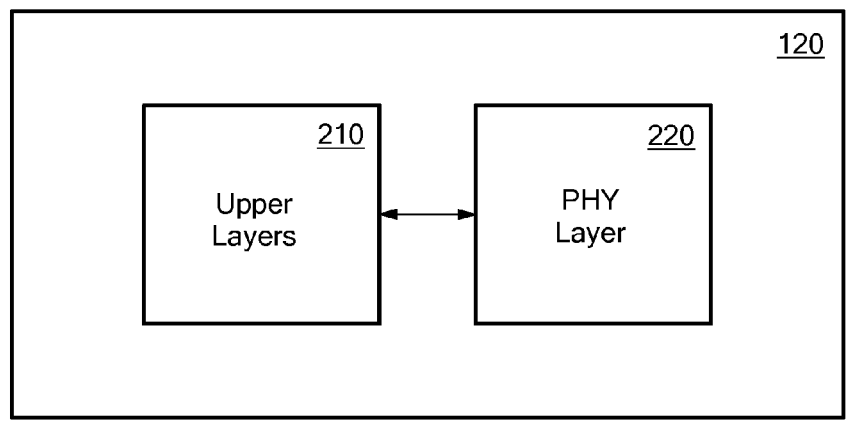
FIG. 2 is a block diagram showing relevant components of a digital chip in accordance with an embodiment of the present invention.

FIG. 2 is a block diagram showing relevant components of the digital chip 120 in accordance with an embodiment of the present invention. Among other things, the digital chip 120 includes physical (PHY) layer logic 220 and upper layer logic 210. The upper layer logic 210 typically performs such functions as protocol, packet processing, security, Ethernet, and ATM/aggregation functions. The PHY layer 220 implements the DSL physical layer functions for one or more "flavors" of DSL, including such functions as digital filtering, modulation/demodulation, echo cancellation, Viterbi (trellis) coding/decoding, interleaving/deinterleaving, forward error correction (FEC) coding/decoding, framing, CRC, and scrambling/descrambling.

Figure 3:
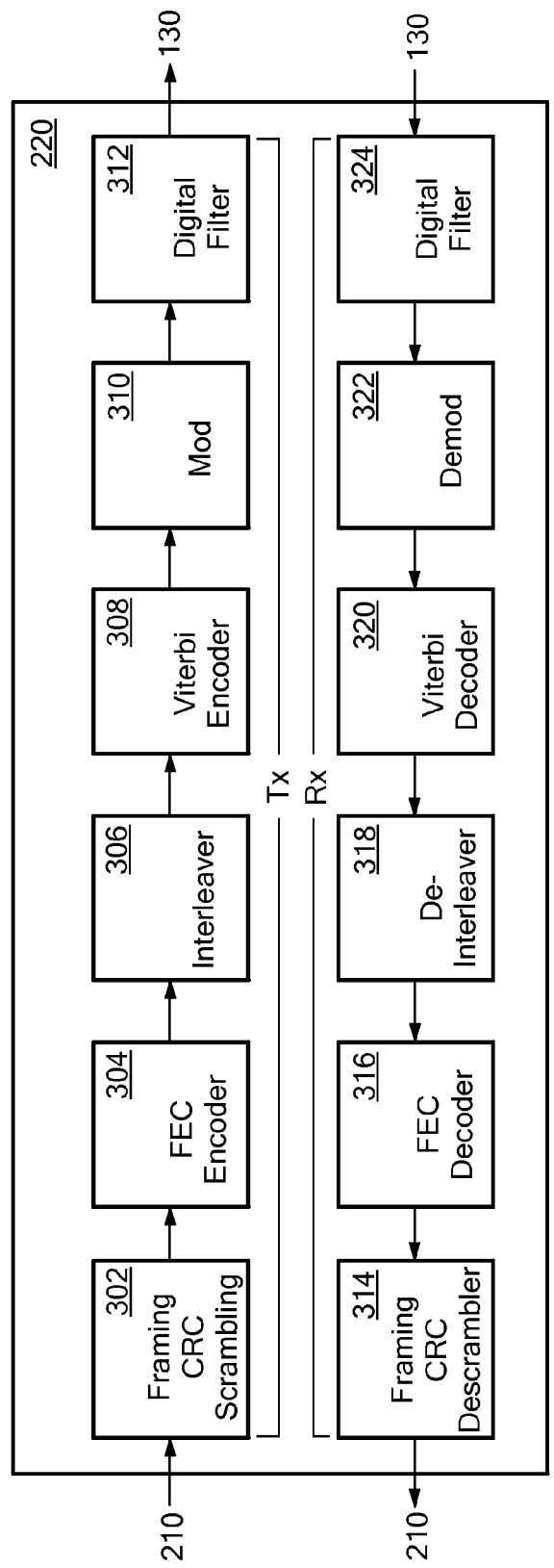
FIG. 3 shows the general structure of the physical layer in accordance with an embodiment of the present invention.

FIG. 3 shows the general structure of the PHY layer 220 in accordance with an embodiment of the present invention. PHY layer 220 components are divided generally into transmitter (Tx) components and receiver (Rx) components. The transmitter components typically include framing/CRC/scrambling logic 302, FEC encoding logic 304, interleaving logic 306, Viterbi encoding logic 308, modulation logic 310, and digital filtering logic 312. The receiver components typically include digital filtering logic 324, demodulation logic 322, Viterbi decoding logic 320, deinterleaving logic 318, FEC decoding logic 316, and framing/CRC/descrambling logic 314.

Within the DSL modem 110, digital filtering is used to perform such functions as finite impulse response (FIR) filtering, infinite impulse response (IIR) filtering, echo cancellation, decimation, and interpolation. It should be noted that the type(s) of filtering, the topology of the filters (i.e., where in the transmitter and receiver paths the filtering gets done), and the filter parameters can be selected for a particular implementation, DSL version, or line condition.

Figure 4:
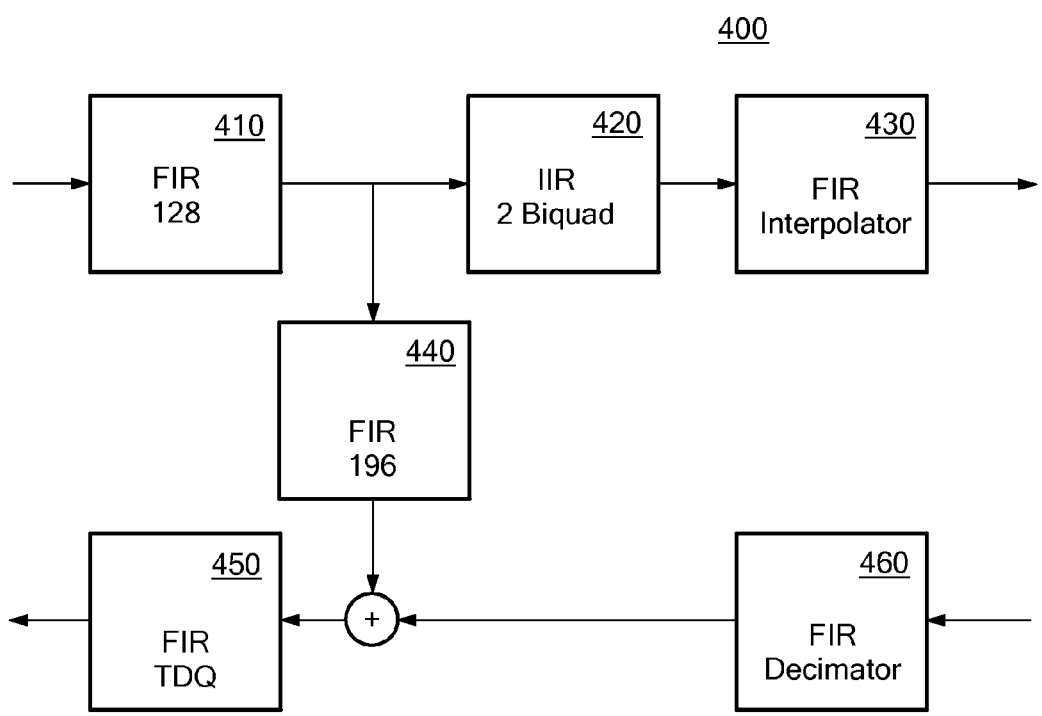
FIG. 4 shows an exemplary digital filter configuration 1 that might be used in a digital subscriber line modem under good line conditions.

FIG. 4 shows an exemplary digital filter configuration 400 that might be used in a DSL modem under good line conditions. In the transmit path, the signal is filtered using a FIR filter 410 with 128 taps, an IIR filter 420 with two bi-quads, and an FIR-based interpolator 430. In the receive path, the signal is filtered using an FIR-based decimator 460 and is combined with the output from an FIR echo canceller 440 with 196 taps, and the resulting signal is filtered using an FIR filter 450.

Figure 5:
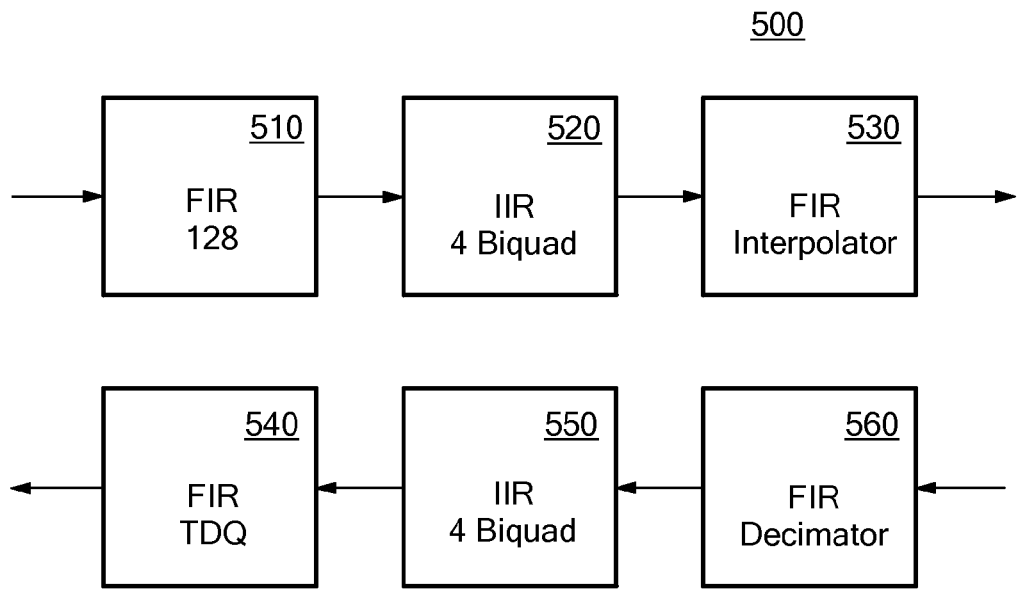
FIG. 5 shows an exemplary digital filter configuration that might be used in a digital subscriber line modem under bad line conditions.

FIG. 5 shows an exemplary digital filter configuration 500 that might be used in a DSL modem under bad line conditions. In the transmit path, the signal is filtered using an FIR filter 510 with 128 taps, an IIR filter 520 with four bi-quads, and an FIR-based interpolator 530. In the receive path, the signal is filtered using an FIR-based decimator 560, an IIR filter 550 with four bi-quads, and an FIR filter 540. There is no echo canceller in this configuration.

Figure 6:
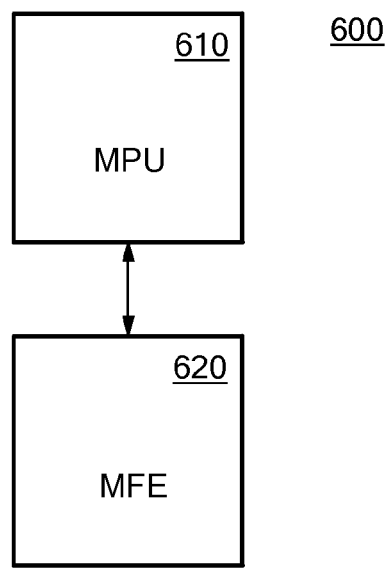
FIG. 6 is a block diagram showing a digital filtering system in accordance with an embodiment of the present invention.

In order to support various types of digital filtering functions, embodiments of the present invention preferably include a micro-programmable filter engine (MFE) that can be programmed to implement multiple types of filter and perform multiple filtering operations essentially in parallel. FIG. 6 is a block diagram showing a digital filtering system 600 in accordance with an embodiment of the present invention. Among other things, the digital filtering system 600 includes a main processing unit (MPU) 610 interconnected with a MFE 620. The MPU 610 programs the MFE 620 to implement various digital filters and perform various digital filtering operations.

Figure 7:
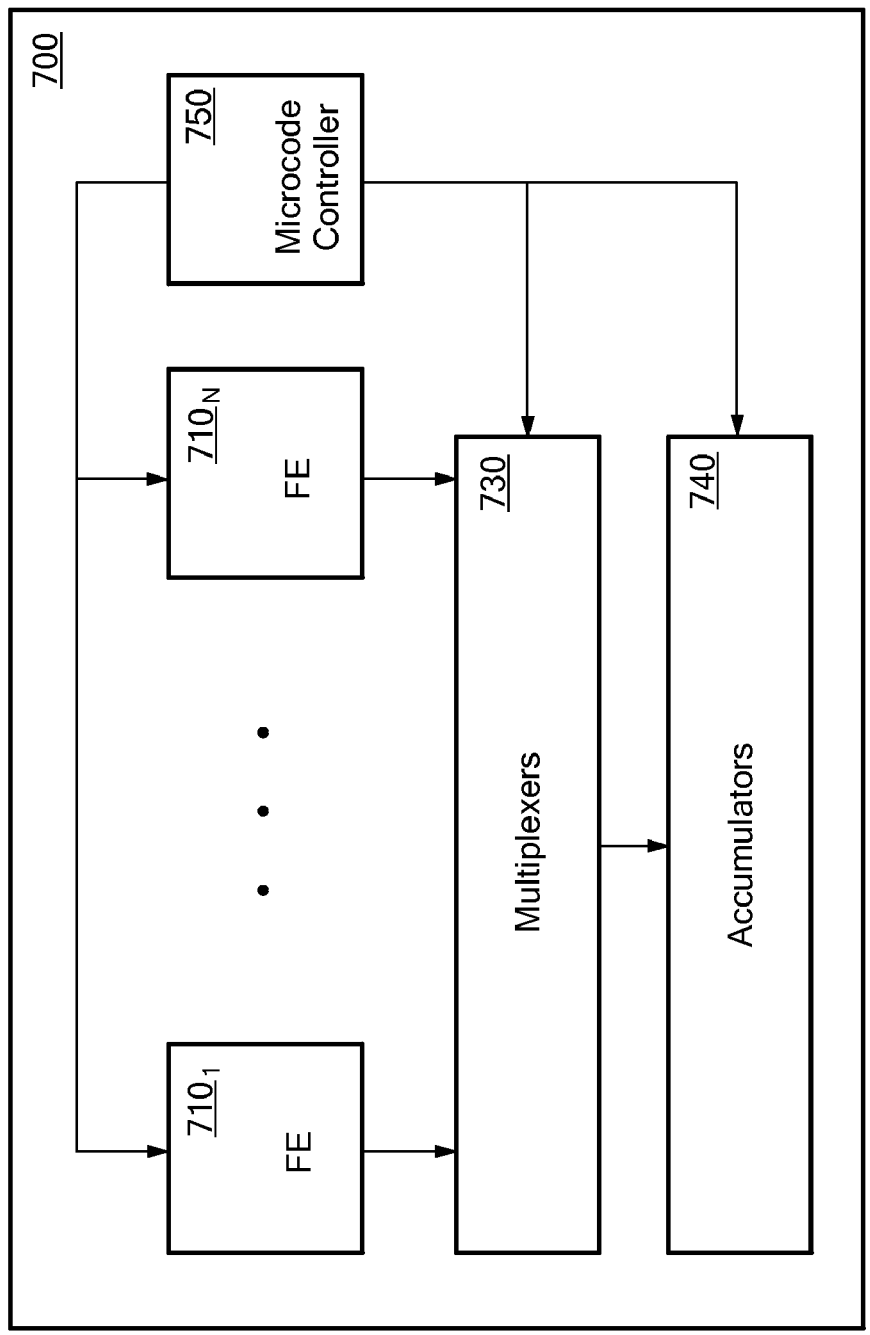
FIG. 7 is a block diagram the general architecture of an micro-programmable filter engine in accordance with an embodiment of the present invention.

FIG. 7 is a block diagram the general architecture of an MFE 700 in accordance with an embodiment of the present invention. Among other things, the MFE 700 includes a number of programmable filter elements (FEs) $710_1$-$710_N$ (referred to individually as an FE 710 and plurally as FEs 710), a number of programmable multiplexers 730, a number of programmable accumulators 740, and a microcode controller 750 for programming and controlling the various programmable elements. In an exemplary embodiment of the invention, the MFE 700 includes four accumulators 740. The multiplexers 730 and the four accumulators 740 allow for five separate digital filters to be implemented simultaneously. Among other things, the microcode controller 750 partitions the FEs 710 into separate functions (e.g., a particular filtering application may require two or more FEs 710 working in conjunction) and performs data movement between FEs 710.

Within the MFE 700, the FEs can be configured individually and can be configured so as to perform multiple filtering functions simultaneously. A single FE 710 can be used to perform a particular filtering function, or multiple FEs 710 can be "cascaded" to form longer filters as discussed below. The microcode controller 750 can control the multiplexers 730 to direct any FE 710 to any accumulator 740 and can control the multiplexers 730 so that multiple FEs 710 are directed to one accumulator 740.

Thus, a collection of filter elements can be used to implement a single, large filter or a number of small filters, by simply configuring the operation of each filter element. The filter element has the property of being cascadable, or connected in series, to allow the implementation of large filters. A large N-tap filter is implemented across multiple filter elements by computing partial sum of products in each filter element and then summing the filter element outputs. Preferred embodiments are flexible enough to allow execution of FIR filters, IIR filters, and different FIR variations such as decimation and interpolation.

In an exemplary embodiment of the present invention, the MFE includes two types of FEs. The first type of FE (referred to hereinafter as the FE0 filter element) can be used to implement FIR filters as well as other functions such as decimation and interpolation. The second type of FE (referred to hereinafter as the FE2 filter element) includes two FE0 filter elements and additional logic, and can be used to implement both IIR filters and FIR filters as well as other functions such as decimation and interpolation. The FE0 and FE2 filter elements are described more fully below.

Figure 8:
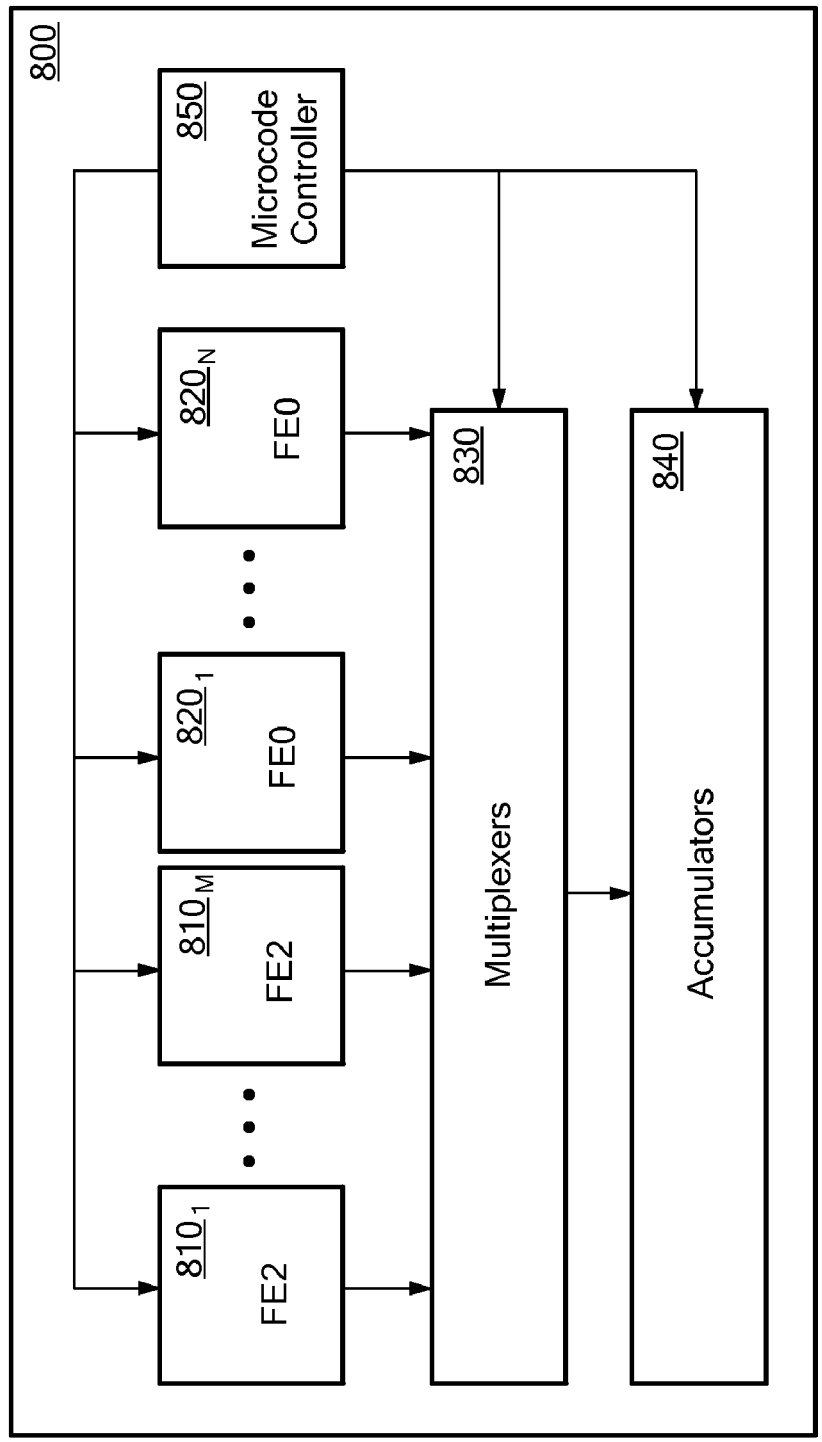
FIG. 8 is a block diagram showing the general architecture an exemplary micro-programmable filter engine having both FE2 filter elements and FE0 filter elements in accordance with an embodiment of the present invention.

FIG. 8 is a block diagram showing the general architecture an exemplary MFE 800 having both FE2 filter elements $810_1$-$810_M$ (referred to individually as an FE2 810 and plurally as FE2s 810) and FE0 filter elements $820_1$-$820_N$(referred to individually as an FE0 820 and plurally as FE0s 820) in accordance with an embodiment of the present invention. The number of FE2s 810 is preferably selected based on a predetermined maximum number of IIR filters that will need to be supported by the DSL modem for whatever DSL variants are supported by the DSL modem. In a preferred embodiment of the present invention, the MFE includes six FE2s 810 and nine separate FE0s 820. The MFE 800 also includes a number of programmable multiplexers 830, a number of programmable accumulators 840, and a microcode controller 850 for programming and controlling the various programmable elements.

The FE0 filter element is a basic filter element designed specifically for implementing FIR filters, but can also be used to implement other FIR-like functions such as decimation and interpolation. The preferred FE0 can support up to a 64-tap filter, although multiple FE0s can be cascaded to form longer FIR filters.

Figure 9:
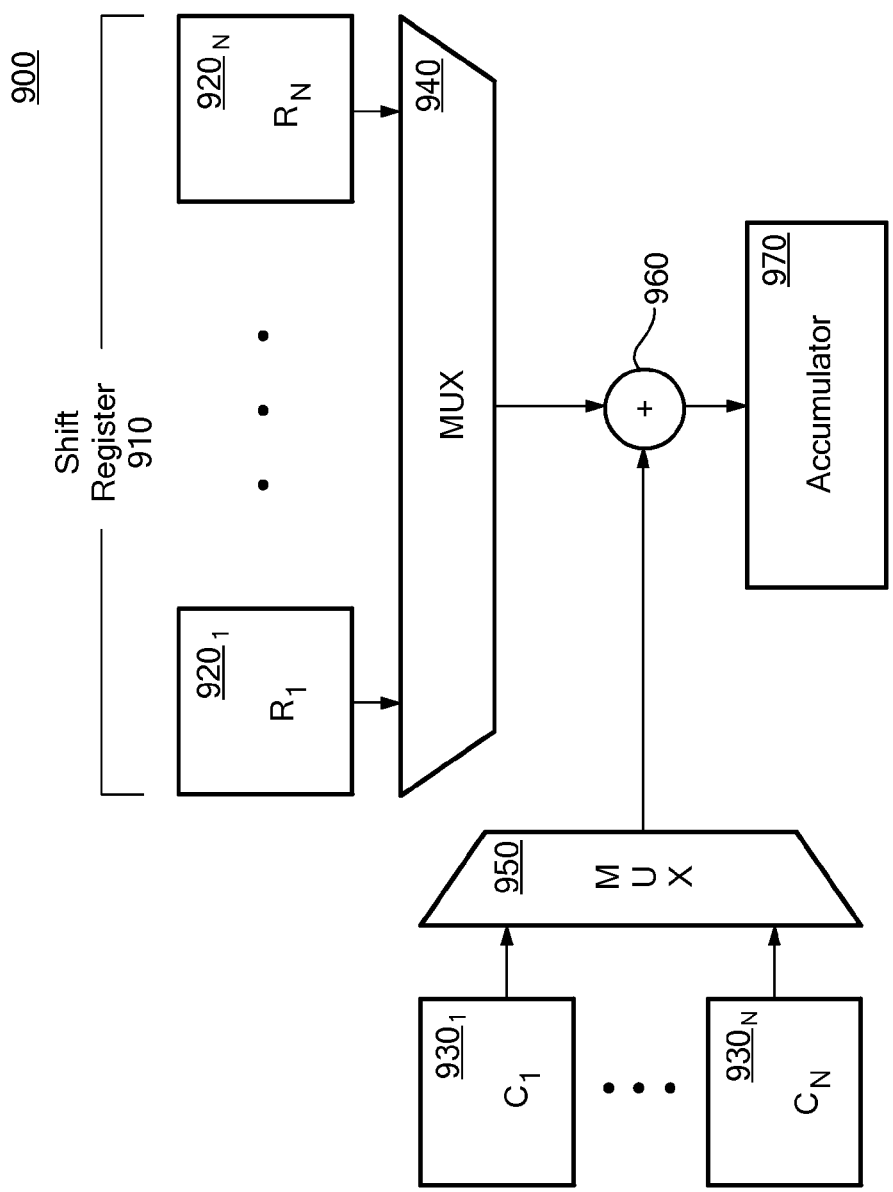
FIG. 9 shows an exemplary architecture for a finite impulse response filter as known in the art.

In traditional N-tap FIR filter implementations, data passes through an N-stage shift register where the output of each stage is multiplied with a corresponding coefficient, and the sum of the products constitutes the filter output. FIG. 9 shows an exemplary architecture for a FIR filter 900 as known in the art. The FIR filter 900 has a shift register 910 consisting of a number of interconnected flip-flops $920_1$-$920_N$ (R1-RN) and a number of coefficient registers $930_1$-$930_N$ (C1-CN). Using the multiplexers 940 and 950 and the multiplier 960, each register 920 is multiplied by a corresponding coefficient 930, and the result is stored in an accumulator 970. A typical FIR filter might have 128 filter taps (i.e., N=128). For 16-bit data, the shift register is typically 16 deep (i.e., each register R includes 16 flip-flops).

In preferred embodiments of the present invention, the FE0 filter element uses memory instead of registers to store both data and filter coefficients in order to reduce the amount of hardware necessary. Specifically, the shift registers and the coefficient registers are replaced with small random access memories and associated control logic. For convenience, the memory that replaces the shift register is referred to as the Data Memory (DM) and the memory that replaces the coefficient registers is referred to as the Coefficient Memory (CM). Among other things, the control logic manipulates the data in the DM so as to emulate a shift register, specifically by performing appropriate "read-modify-write" operations (e.g., read a word from the memory, shift it one bit, and write it back to the memory). The FE0 architecture takes advantage of the speed of modern integrated circuitry and iterates in time the multiply-accumulate function of the filter in such a way that allows on-the-fly configuration of the filter properties. A much faster clock than the frequency of the incoming data clock is used to operate the filter. The size of the DM and the CM is determined by the ratio of the system clock to that of the incoming data, such that, for each data input, a filter output is generated.

Figure 10:
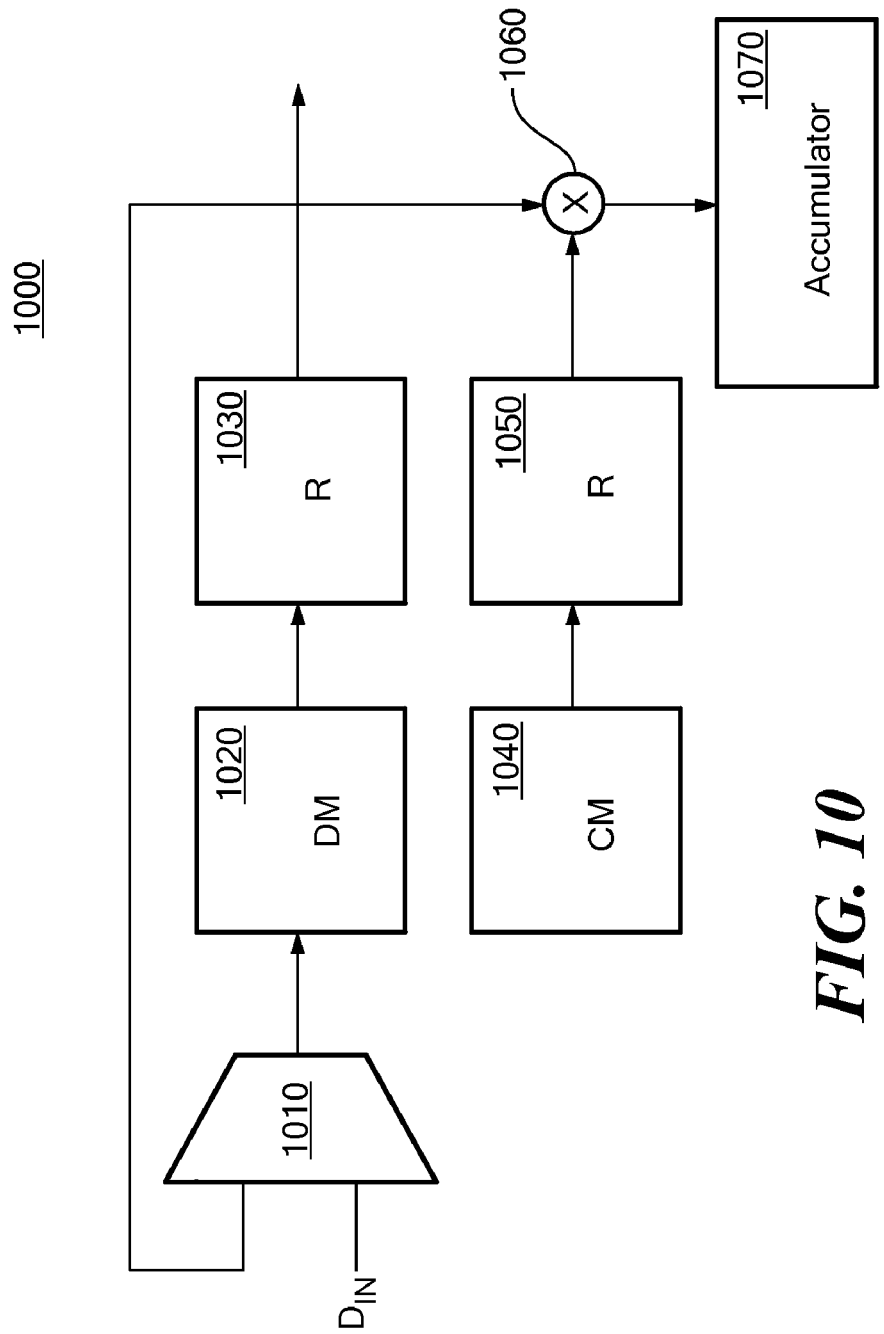
FIG. 10 is a block diagram showing the general architecture of a preferred FE0 filter element in accordance with an embodiment of the present invention.

FIG. 10 is a block diagram showing the general architecture of a preferred FE0 filter element 1000 in accordance with an embodiment of the present invention. Among other things, the FE0 filter element 1000 includes a multiplexer 1010, a data memory (DM) 1020, a register 1030, a coefficient memory (DM) 1040, a register 1050, a multiplier 1060, and an accumulator 1070. A loopback path from the register 1030 to the multiplexer 1010 allows data to be read from the DM 1020, shifted, and written back into the DM 1020. Data read from DM 1020 into register 1030 is multiplied by a corresponding coefficient read from CM 1040 into register 1050 using multiplier 1060, and the result is stored in an accumulator 1070. In an exemplary embodiment of the invention, the DM 1020 and the CM 1040 are 64×16 bit random access memories, and so the FE0 1000 can implement up to a 64-tap FIR filter. It should be noted that multiple FE0s can be cascaded in order to form FIR filters having more than 64 taps (e.g., two FE0s can be cascaded to form a 128-tap filter with functionality similar to that shown in FIG. 9). It should also be noted that an FE0 can be used to implement a filter having fewer than 64 taps and that multiple FE0s can be used to form filters where the number of taps is not a multiple of 64 (e.g., can use 48 bits from each of two FE0s to form a filter with 96 taps).

The FE2 filter element is a more complex filter element designed specifically for implementing both FIR and IIR filters, but can also be used to implement other FIR-like functions such as decimation and interpolation. In preferred embodiments of the invention, each FE2 contains two FE0 filter elements and additional hardware, including a filter controller (FC), a barrel shifter, and an output accumulator. The FE0 blocks can operate independently or can be cascaded to form various filters. The FE2 can be used to implement some number of bi-quads for IIR filtering (where the number of bi-quads depends on, among other things, the number of clock cycles per symbol) or up to a 128-tap FIR filter. In the FE2, the computation resolution of the IIR filter is twice that of the FIR filter. The IIR filter execution is based on microcode stored in a small instruction memory within the FC. Each instruction is capable of executing multiple data moves.

In certain embodiments of the present invention, the FC includes an instruction memory, a program counter, and two identical instruction decoders, one for each FE0 filter element. A delay is introduced between the two instruction decoders so that the two instruction decoders operate in a ping-pong fashion in order to share the single instruction memory. A program to execute a bi-quad starts at time n, is decoded with the first instruction decoder, and runs on the first FE0 filter element. The same program, delayed by one clock, is decoded with the second instruction decoder, and runs on the second FE0 filter element. The delay facilitates resource sharing when partial results need to be scaled in the barrel shifter or partially summed at the output accumulator.

Figure 11:
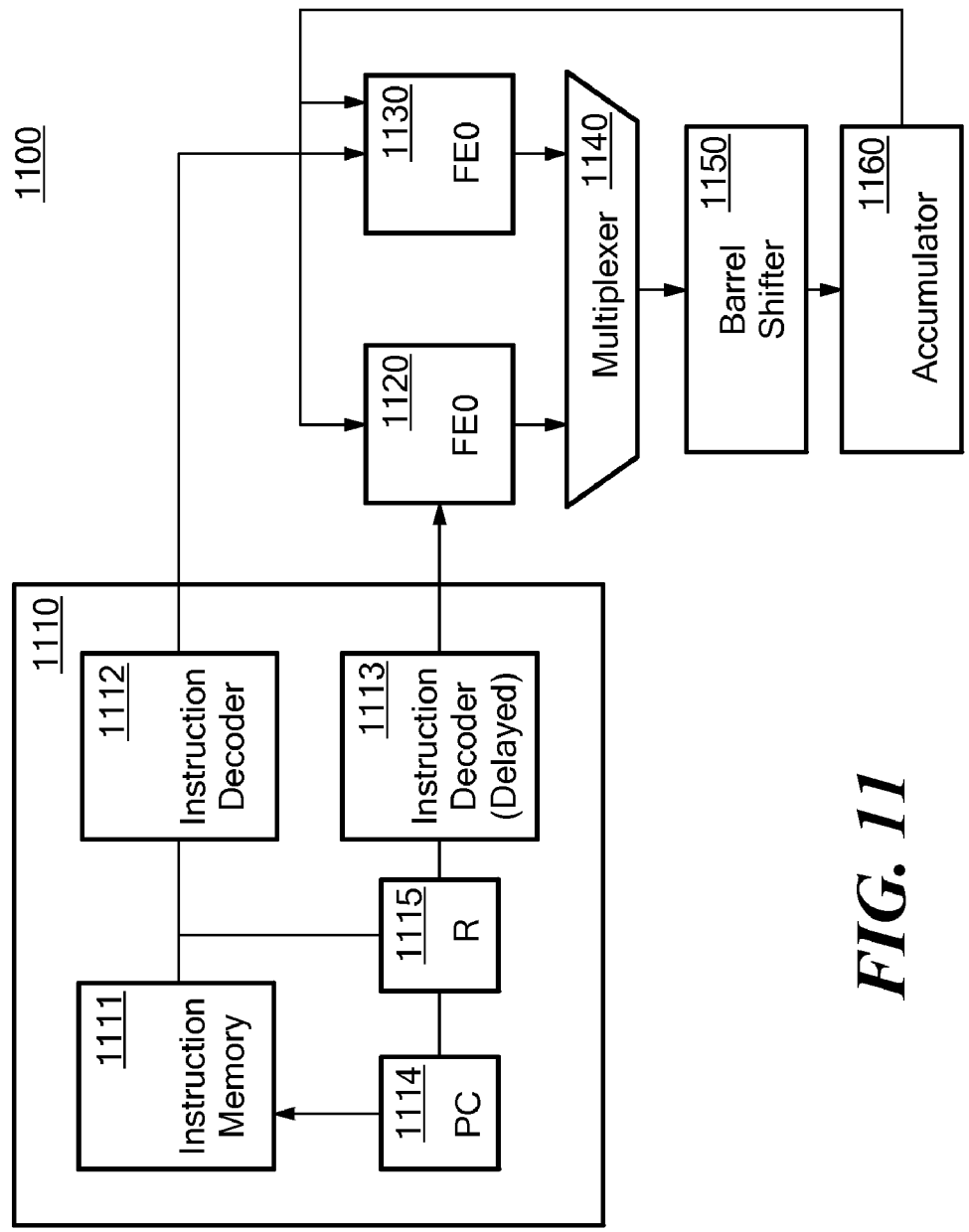
FIG. 11 is a block diagram showing the general architecture of the FE2 filter element in accordance with an embodiment of the present invention.

FIG. 11 is a block diagram showing the general architecture of the FE2 filter element 1100 in accordance with an embodiment of the present invention. Among other things, the FE2 filter element 1100 includes a filter controller (FC) 1110, two FE0 filter elements 1120 and 1130, a multiplexer 1140, a barrel shifter 1150, and an accumulator 1160. As discussed above, the FC 1110 includes an instruction memory 1111, two identical instruction decoders 1112 and 1113, program counter 1114, and register 1115. Operation of the instruction decoder 1113 is delayed by one clock cycle from that of the instruction decoder 1112 so that both can share the instruction memory 1111.

For IIR filtering, the number of bi-quads that can be executed by the FE2 filter element 1100 is dependent on the rate of the incoming data and the execution length for each bi-quad. Assuming that an input sample arrives every M clock cycles and that a bi-quad is computed in W clock cycles, the maximum number of bi-quads that can be calculated is the integer result of the ratio M/W. During execution of K bi-quads (K>1), the microcode repeats the same instruction sequence K times in a zero-overhead loop. When in FIR mode, only the filter elements 1120 and 1130, multiplexer 1140, barrel shifter 1150, and output accumulator 1160 portions of the block are active. The number of taps N in the FIR filter is dictated by the ratio of the system clock to the data clock, where the data clock is defined as the slower rate of either rate at which data is produced by the filter or applied to the filter. Each FE0 1120, 1130 is capable of computing up to N taps and the two FE0s 1120, 1130 can be cascaded to compute up to 2N taps. Running concurrently, each FE0 produces a partial result that gets summed to the output accumulator 1160 in the final tally.

In preferred embodiments of the invention, the double-precision data flow graph of the FE2 is split into two merged single precision data flow graphs. This allows double-precision operations of the FE2 to be run on two FE0 functional blocks. Specifically, as described above, each FE0 functional block is a 16-bit block, and the FE2 functional block is a 32-bit block. Implementing an IIR filter using the FE2 functional block involves multiplying a 16-bit coefficient by a 32-bit value to produce a 48-bit value (i.e., C[15:0]*D[31:0]). The multiplication problem is preferably split into two parts, specifically C[15:0]*D[31:16]+C[15:0]*D[15:0]. The barrel shifter and accumulator allow the upper product and the lower product to be added. The 48-bit values are fed back into the two FE0 blocks (see FIG. 9).

A particular feedback technique combines inter-bi-quad scaling with the summation of intermediate values. With reference to FIG. 9, the 48-bit values produced by FE2 double-precision computations are fed back into the two 16-bit FE0 blocks. This requires scaling of the 48-bit values. This scaling is done on the fly by controlling the barrel shifter.

Figure 12:
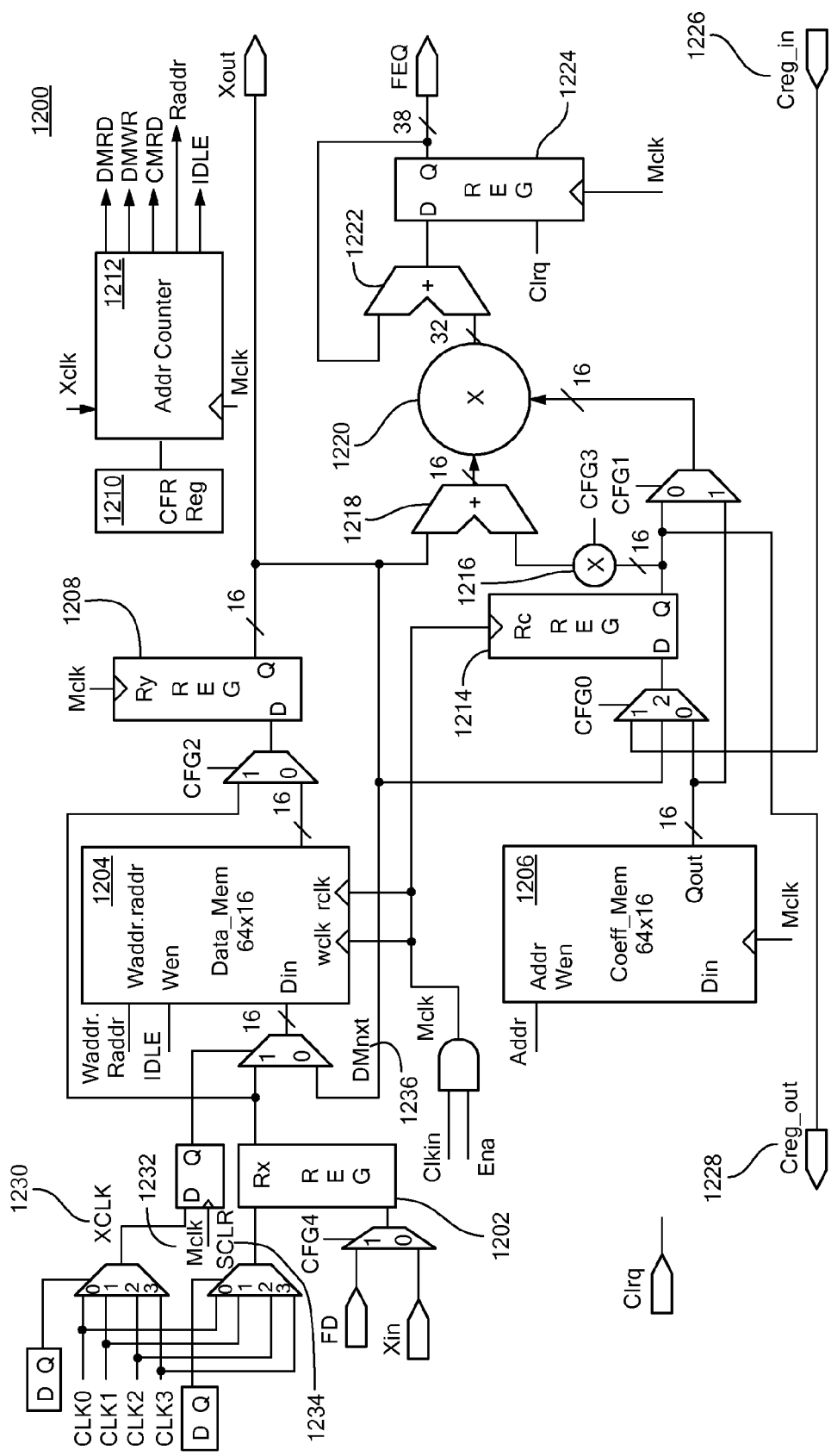
FIG. 12 is a schematic diagram showing the relevant components of an FE0 filter element in accordance with an embodiment of the present invention.

FIG. 12 is a schematic diagram showing the relevant components of an FE0 filter element 1200 in accordance with an embodiment of the present invention. Among other things, the FE0 1200 includes a data memory (DM) 1204, a coefficient memory (CM) 1206, configuration registers (CFR) 1210, various multipliers and accumulators (MAC), and an address generator (ADG) 1212. The function of each component will be described in detail.

Within the MFE, each FE0 is typically connected to two adjacent filter elements. Specifically, the CREG_OUT output 1228 of one FE0 is connected to the CREG_IN input 1226 of the adjacent FE0. A similar interconnection between the two FE0 filter elements of the FE2 filter element exists.

The FE0 is event driven. Therefore, a single pulse on XCLK 1230 triggers the element to complete a single sweep of execution, as programmed in CFR 1210. Single loops or nested loops can be run, as described below.

Figure 13:
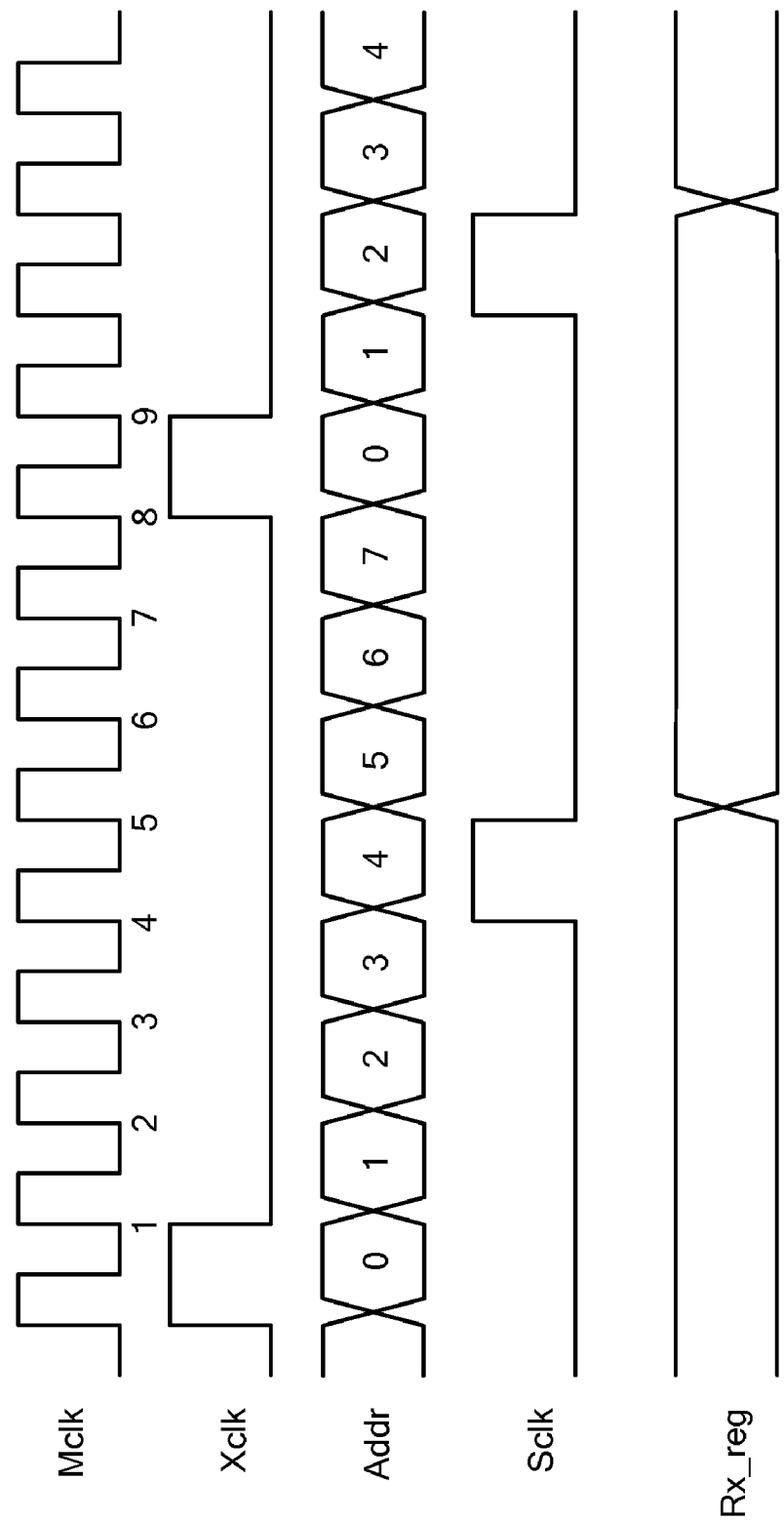
FIG. 13 is a timing diagram illustrating operation of a typical eight-tap FIR filter in accordance with an embodiment of the present invention.

FIG. 13 is a timing diagram illustrating operation of a typical eight-tap FIR filter in accordance with an embodiment of the present invention. Sclk 1234 signals the loading of a new data sample into register X (Rx) 1202. Xclk 1230 provides the trigger to launch a single sweep operation. The master clock (Mclk) 1232 actually clocks all memories and storage elements in the FE0 so that the write and read addresses of the DM 1204 are the same. The expected result of the FIR filter is:

$$MAC(n) = \{DS(n)*C0 + DS(n-1)*C1 + \ldots + DS(n-7)*C7\}$$

or, $$MAC(n) = \Sigma_{i=0}^{7} DS(n-i)*C_i$$

where DS(x) represents data sample x and Cy represents coefficient y. These conventions will be continued in the discussion below.

When programmed as an FIR filter, the FE0 essentially works as follows. First, it is assumed that DM[7:0] contains {DS(n−8).DS(n−1)} and CM[7:0] contains {C7...C0}. The MAC accumulates [Ry*Rc], where Ry is register Y 1208 and Rc is register C 1214.

At Mclk(1), the current content of DM(0), which is DS(n−1), is loaded into Ry 1208 and the current content of CM(0), which is C0, is loaded into Rc 1214. Rx(n) is selected through multiplexer DMnxt 1236 and is written into DM(0), or, DS(n) which was loaded into register Rx 1202 on the last Sclk 1234 event is DM location 0. The MAC is loaded with DS(n−8)*C7. The MAC content at this point is transferred to a holding register 1224 because it contains a sample output.

At Mclk(2), DM(1), which is DS(n−2), is loaded into Ry 1208 and CM(1) is loaded into Rc 1214. DMnxt 1236 points to Ry 1208 and the current content of Ry 1208, which is DS(n−1), is written into DM(1). The MAC is overwritten with DS(n−1)*C0. The overwrite operation is important because it sets up the MAC for computing the next sample output.

At Mclk(3)-Mclk(8), the process described above for Mclk (2) is repeated. DM(k) is DS(n−k−1) and is loaded into Ry 1208 while CM(K) is loaded into Rc 1214. The current content of Ry 1208 is written into DM(k). The MAC is accumulated with Ry*Rc.

Figure 14:
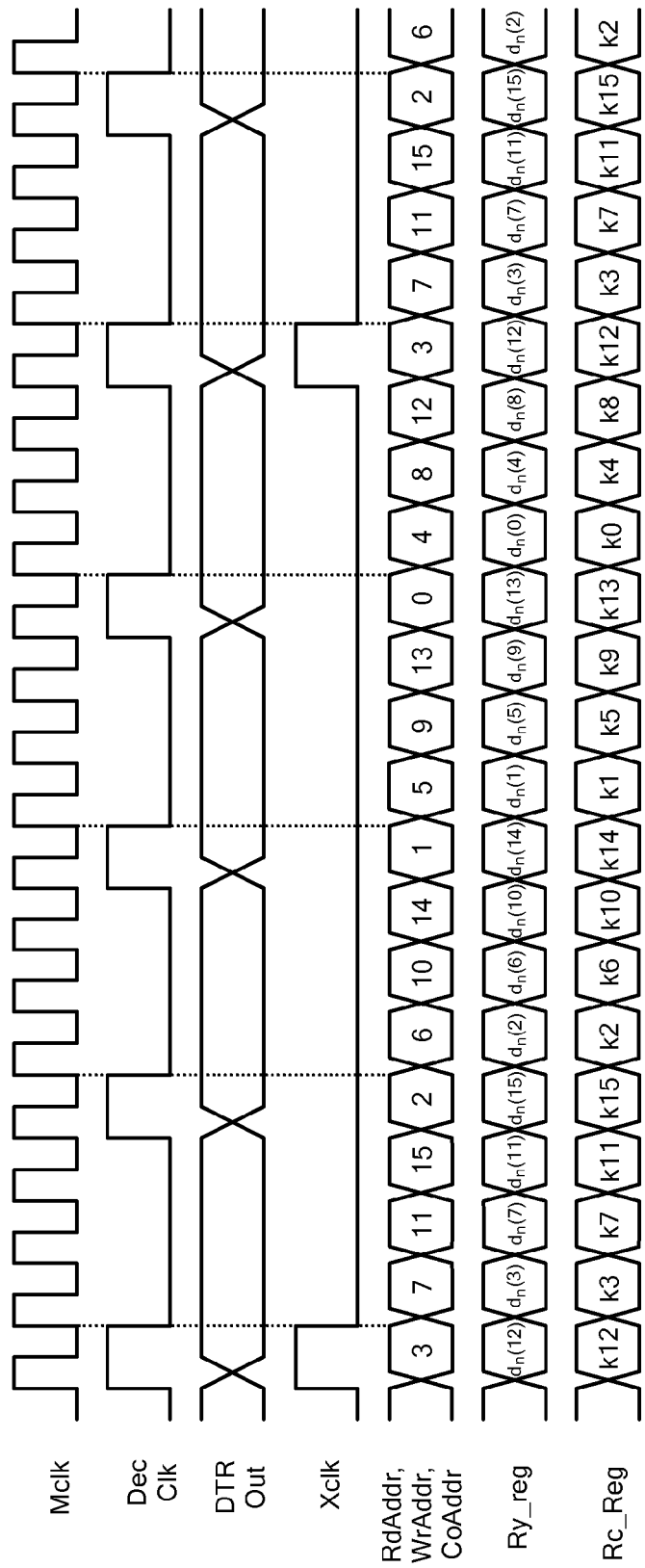
FIG. 14 is a timing diagram illustrating operation of a decimator for ADSL++ decimation by four in accordance with an embodiment of the present invention.
Figure 15:
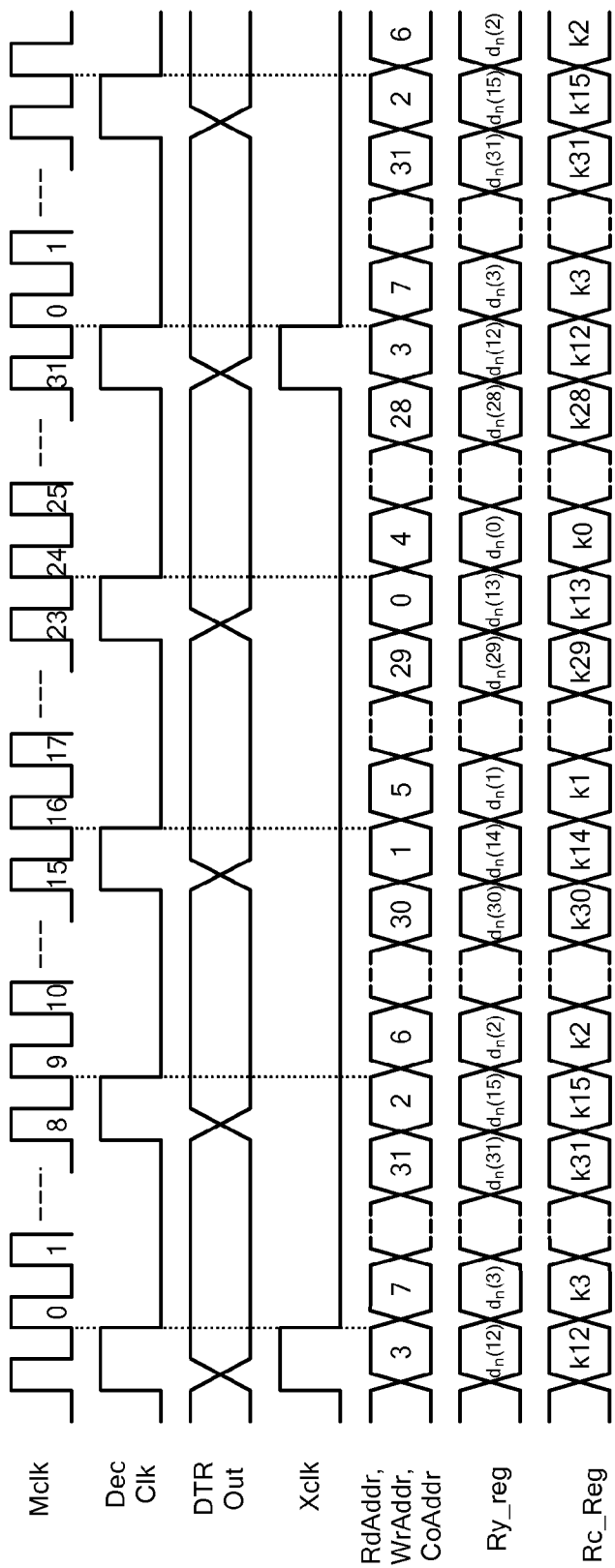
FIG. 15 is a timing diagram illustrating operation of a decimator for ADSL+ decimation by four in accordance with an embodiment of the present invention.

FIG. 14 is a timing diagram illustrating operation of a decimator for ADSL++ decimation by four in accordance with an embodiment of the present invention. FIG. 15 is a timing diagram illustrating operation of a decimator for ADSL+ decimation by four in accordance with an embodiment of the present invention. For every four input samples, the decimator generates a single output. The data memory DM is segmented into groups of four as shown below and the write and read addresses of the memory are the same. Data is shifted from a column to the adjacent column on the left.

| | | | | |
|---|---|---|---|---|
| Din(3) → | [3] | [7] | [11] | [15] |
| Din(2) → | [2] | [6] | [10] | [14] |
| Din(1) → | [1] | [5] | [9] | [13] |
| Din(0) → | [0] | [4] | [8] | [12] |
| | Data shifts from right to left → | | | |

FIGS. 14 and 15 show the alignment of Ry and Rc contents to produce the desired output. Input samples are loaded into DM by DecClk and output samples are clocked out on xclk. In the general case of decimation by n for a filter with length L, the DM is partitioned to L/n columns with n members in each column.

Figure 16:
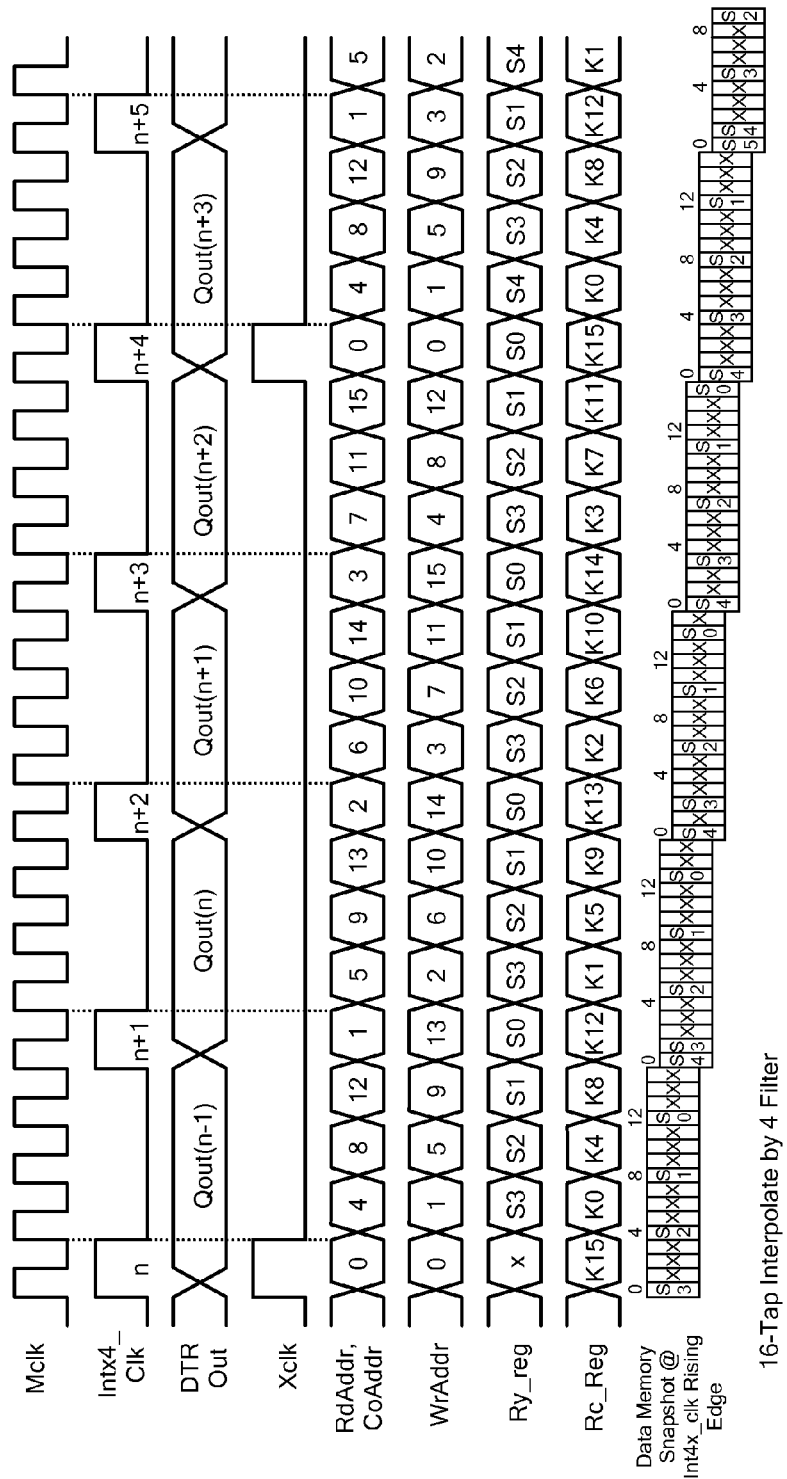
FIG. 16 is a timing diagram illustrating an exemplary interpolation by four for a 16-tap filter in accordance with an embodiment of the present invention.

FIG. 16 is a timing diagram illustrating an exemplary interpolation by four for a 16-tap filter in accordance with an embodiment of the present invention. For every input sample, the filter generates four output samples. The DM read and write addresses of the interpolator are different. The bottom of FIG. 16 shows the position of input data samples in DM. At Intx4_clk(n), data samples 3, 2,1, and 0 are in positions 0, 4, 8, and 12, respectively. Therefore, output Qout(n)=K0*DM(4)+K4*DM(8)+K8*DM(12)+K12*DM(1). The contents of DM(12,8,4,1) are S2, S1, S0 and S3 respectively. Therefore, Qout(n+1)=Qout(n)+K1*DM(5)+K5*DM(9)+K9*DM(13)+K13*DM(2), where DM[5,9,13,2] contain S3, S2, S1 and S0 respectively. The process is repeated every Intx4_clk and the accumulator output is overwritten every Xclk. During the course of an Xclk period, the newest four data samples are multiplied with the full set of coefficients K[15:0] and the product is accumulated.

The dual loop mode is used to generate the proper addressing for executing the decimator and interpolator functions as described previously. The following is a description of how this mode operates. It is assumed that LP1 counts down LP1_N times and its initial value is LP1_BASE (loaded in LP1_CNTR) and that LP0 counts LP0_N times (loaded in LP0_CNTR) with a displacement of LP0_INCR. The first value of LP1 (LP1_BASE) is loaded into the output REG to coincide with the assertion of Xclk, LP1_CNTR decrements by 1 so that LP1_CNTR contains (LP1_BASE−1), and LP0_CNTR pre-loads with the value LP0_N. On the next LP0_N Mclk, the content of output REG is LP1_BASE+n*LP0_INCR, where n∈1, 2 ... LP0_N. The corresponding value in LP0_CNTR is LP0_N−n. When LP0_CNTR=0, then the next clock coincides with Xclk and the new value of LP1_BASE is loaded into the output REG, and the second pass of LP1 begins. The entire process described above is repeated until both loop counters LP1 and LP0 expire, or equal zero. The output REG is loaded with LP1_BASE in anticipation of the next Xclk. The number of Mclks for completing a sweep is (LP1_BASE+1)*(LP0_N+1).

The single loop mode provides the addressing generation function for simple N-tap FIR filters. It is assumed that LP0 counts LP0_N times (loaded in LP0_CNTR) with a displacement of LP0_INCR. During each sweep, LP0_CNTR counts up LP0_N times and the output REG=n*LP0_INCR. At the end of the sweep, the output REG is reset to zero.

The memory bypass mode is optimized for a fast, symmetric or non-symmetric FIR filter operation. CFG1 and CFG2 must have a value of one, CFG0 a value of one or two depending on its position in the chain of cascaded filters, and the end filter position requires a value of two. Every Xclk, samples are shifted serially through the filter element and the sum of Ry+Rc is multiplied by the CM output. The result is stored in the accumulator (Acc). In non-bypass operation, Rc is multiplied by the default CFG3 value of zero. CFG3 controls the symmetry operation of the filter (zero for non-symmetric, one for symmetric).

Figure 17:
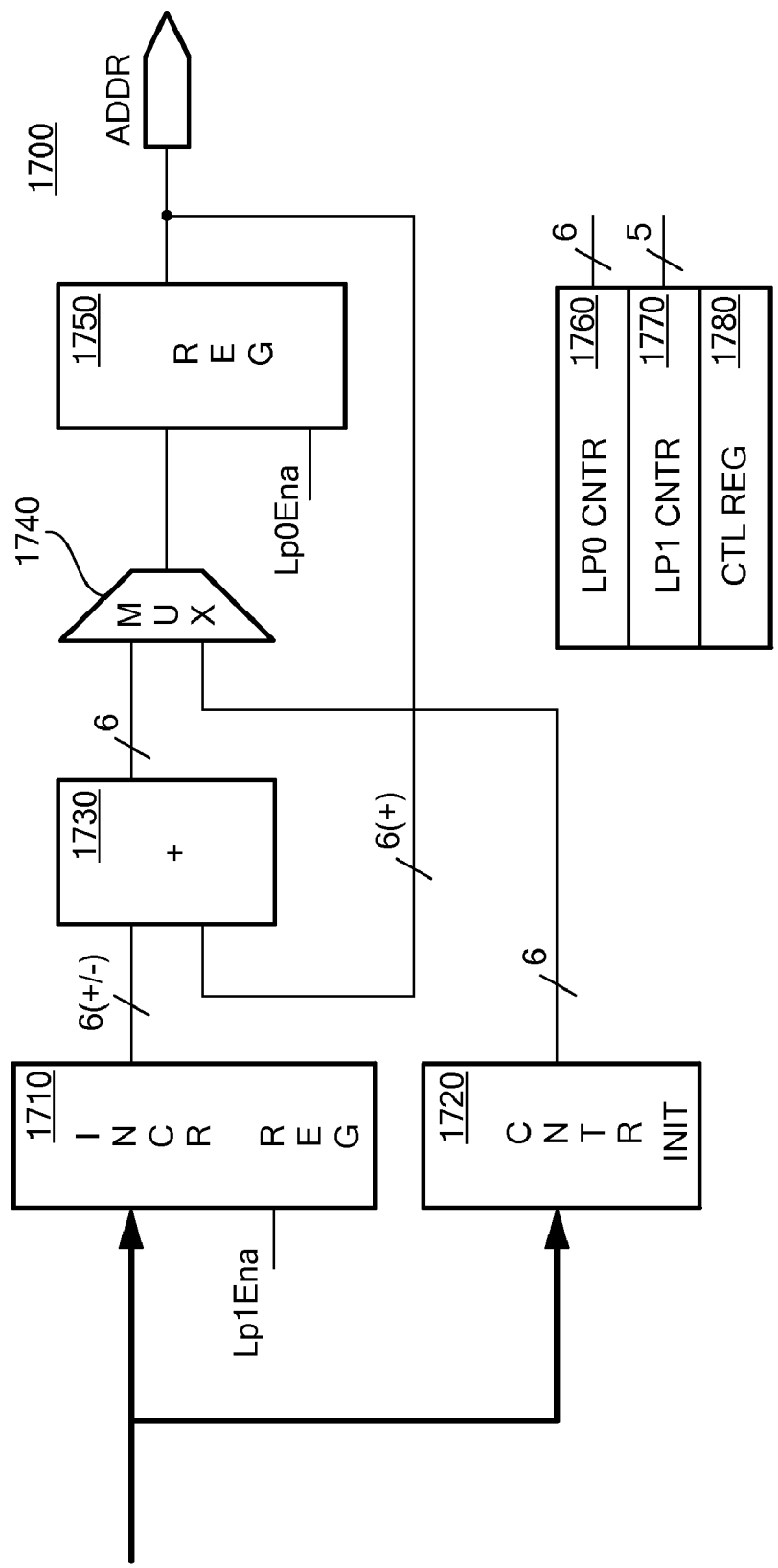
FIG. 17 is a block diagram of an address generator in accordance with an embodiment of the present invention.

FIG. 17 is a block diagram of the address generator (ADG) 1700 in accordance with an embodiment of the present invention. The ADG 1700 controls the overall operation of the FE0. For the sake of discussion, a sweep is defined as the time period between adjacent sample clocks (Xclk), where the Xclk controls the slower data transfer in or out of the FE0. For example, in decimation, Xclk controls the output; in interpolation, Xclk controls the input.

The ADG 1700 operates on the principle that Xclk triggers a single sweep and a sweep is composed of one or two nested loops, namely LP0 and LP1. The INIT CNTR 1720 counts up or down by one. The rest of the structure counts by the displacement of INCR REG 1710 content. LP0 and LP1 counters 1760 and 1770, respectively, control the operation of the nested loops.

The INCR REG 1710 content is a two's complement value ranging from −32 to +31. The adder (ADDR) 1730 output is always positive and ranges between 0 and 63. The INIT CNTR 1720 is always positive. The adder 1730 receives as inputs the contents of INCR REG 1710 and the contents of REG 1750 and sign extends both inputs to seven bits in order to behave correctly and yield a result in the proper range. The multiplexer (mux) 1740 allows either the contents of the INIT CNTR 1720 or the output of the adder 1730 to be directed to REG 1750. The CTL REG 1780 controls operation of the ADG.

An instruction based controller, or engine, can take over the filter element control through the filter controller (FC) port. The FC port provides the flexibility to customize the filter operation being implemented in the FE0 data path. The FE0 is thus capable of implementing FIR and IIR filtering functions. In FE2 configuration, the FC port is used to pass control to FE0.

The following is a description of various FE0 signals including the signal name, direction (I=input, O=output), and width:

| From/To | Signal Name | Dir | Width | Description |
|---|---|---|---|---|
| General | mclk | I | 1 | 144 MHz main digital clock |
| | resn | I | 1 | asynchronous reset |
| | sclk | I | 1 | xclk pulse |
| | fclk | I | 1 | fast clock pulse for interpolation and decimation |
| | fdin | I | 16 | input from top level filter |
| | inrdy | I | 1 | input ready read pulse |
| | fdout | O | 38 | filter output |
| | ready | O | 1 | filter output ready |
| CRB | crb_wrn | I | 1 | crb write enable (low) |
| | crb_rdn | I | 1 | crb read enable (low) |
| | crb_data | I | 16 | crb write data |
| | crb_addr | I | 3 | crb read/write address |
| | crb_rdata | O | 16 | crb read data |
| | crb_drdy | O | 1 | crb read data ready pulse |
| DMA | dma_wrn | I | 1 | dma write enable (low) |
| | dma_rdn | I | 1 | dma read enable (low) |
| | dma_data | I | 16 | dma write data |
| | dma_addr | I | 7 | dma read/write address |
| | dma_rdata | O | 16 | dma read data |
| | dma_drdy | O | 1 | dma read data ready pulse |
| FE0 | xin | I | 16 | input from previous FE0 in chain |
| | creg_in | I | 16 | input from next FE0 in chain |
| | xout | O | 16 | output to next FE0 in chain |
| | creg_out | O | 16 | output to previous FE0 in chain |

-continued

| From/To | Signal Name | Dir | Width | Description |
|---------|-------------|-----|-------|-------------|
| IIR | fd_in | I | 1 | feed input through FE0 without any operations |
|  | rx_xin | I | 1 | write xin to Rx |
|  | ry_ctrl | I | 1 | Ry write enable |
|  | ry_sel | I | 1 | write DM or Rx to Ry |
|  | iDMrda | I | 4 | DM read address |
|  | rc_cm | I | 1 | write CM to Rc |
|  | iCMrda | I | 6 | CM read address |
|  | acc_add | I | 1 | accumulator addition operation |
|  | acc_owt | I | 1 | accumulator overwrite operation |
|  | dm_wen | I | 1 | DM write enable (low) |
|  | iDMwta | I | 4 | DM write address |
|  | iir_ena | I | 1 | IIR mode of operation |
| SCAN | SE | I | 1 | Scan mode of operation |

Figure 18:
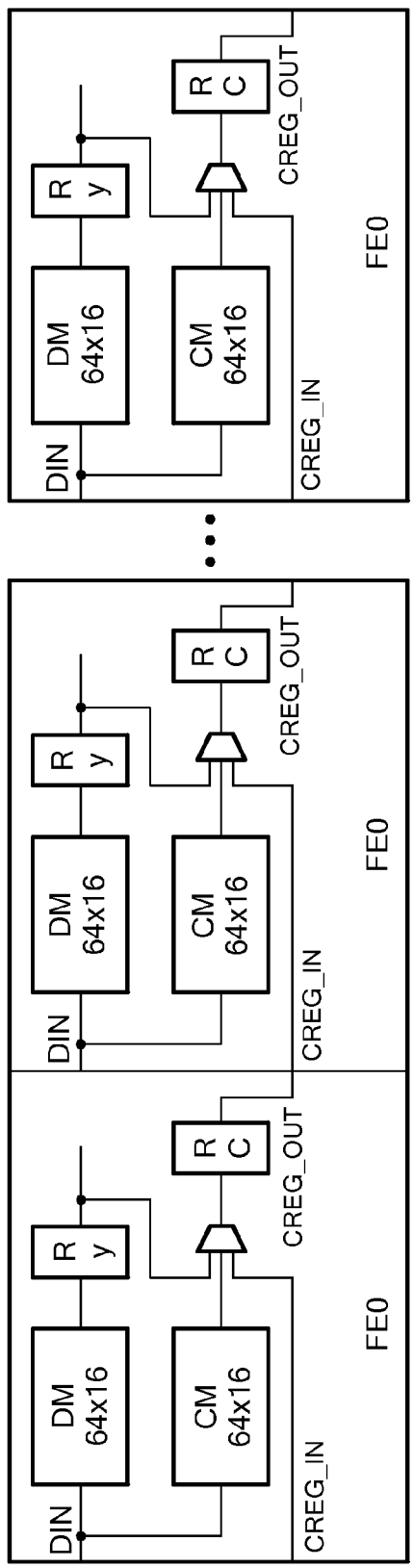
FIG. 18 shows an exemplary data path for memory testing in accordance with an embodiment of the present invention.

For the purpose of testing, registers, adders, multiplexers and MAC will be tested using scan. Memory testing uses special provisioning. Specifically, DM and CM are enclosed in a special wrapper that bypasses the physical memory during scan test. The bypass permits all inputs to connect to the 16-bit output bus of the wrapper in order to provide visibility to the memory control and data inputs. The MPU port is used to write data directly to either DM or CM of any FE0. The read back path to the MPU is not direct but goes through Ry and Rc for DM, or, Rc for CM, of the FE0 under test, plus Rc of each FE0 between the first FE0 and the FE0 under test. The first FE0 is the unit where CREG_OUT drives the MPU data bus. FIG. 18 shows an exemplary data path for memory testing in accordance with an embodiment of the present invention. The FE0s are chained together by connecting the CREG_OUT from one FE0 to the CREG_IN of the adjacent FE0.

In an exemplary embodiment of the present invention, the configuration registers (CFG) are defined as follows:

Name = CFG CTL Addr = 0x00

| Bit(s) | Mnemonic | Description |
|--------|----------|-------------|
| [9] | slave | configure input protocol to be a slave unit |
| [8] | cfg_int | configure for interpolation mode |
| [7] | cfg_dec | configure for decimation mode |
| [6] | cfg_rxi | configure Rx input from fdin or xin |
| [5] | Go | gated mclk signal |
| [4] | cfg_sym | configure into symmetric mode (untested) |
| [3] | cfg_byp | configure into memory bypass mode (untested) |
| [2] | cfg_cms | configure multiplier input (unknown operation) |
| [1:0] | cfg_rci | configure Rc input (untested/unknown operation) |

Name = LP0 CTL Addr = 0x01

| Bit(s) | Mnemonic | Description |
|--------|----------|-------------|
| [5:0] | LP0CNT | number of cycles loop zero runs for |

Name = LP1CTL Addr = 0x02

| Bit(s) | Mnemonic | Description |
|--------|----------|-------------|
| [7] | LP1on | active loop 1 |
| [6] | LP1up | set counter for loop 1 to increment or decrement |
| [5:0] | LP1base | set maximum value for loop 1 counter |

Name = INIT Addr = 0x03

| Bit(s) | Mnemonic | Description |
|--------|----------|-------------|
| [5:0] | INIT | initial value of address if loop 1 is inactive |

Name = INCR Addr = 0x04

| Bit(s) | Mnemonic | Description |
|--------|----------|-------------|
| [5:0] | INCR | value of address incrementing |

Name = intctl Addr = 0x05

| Bit(s) | Mnemonic | Description |
|--------|----------|-------------|
| [6] | int_ectl | enable external interpolation output pulse |
| [5:0] | ip_fval | internal interpolation pulse counter max value |

Figure 19:
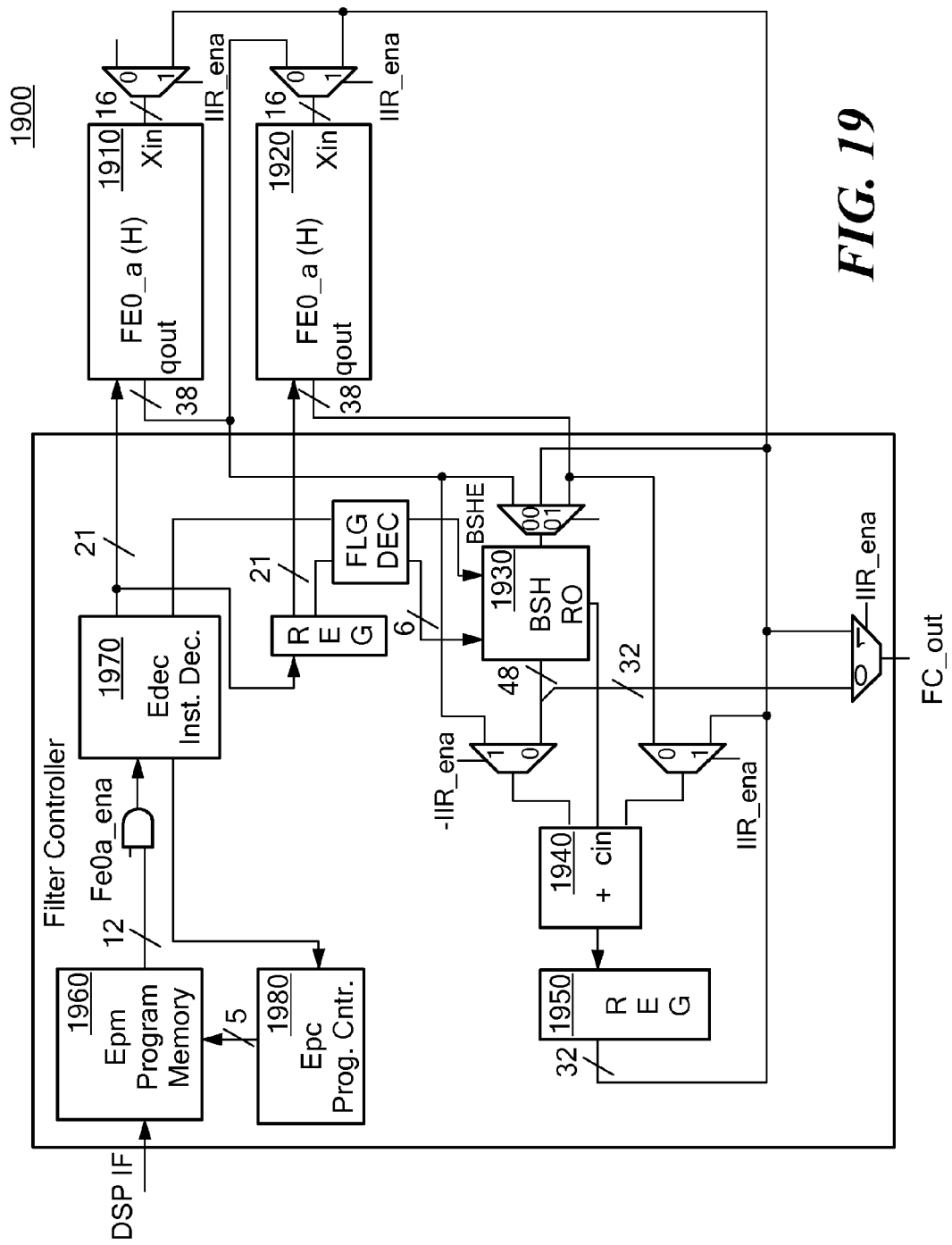
FIG. 19 is a schematic diagram showing the FE2 filter element in accordance with an embodiment of the present invention.

FIG. 19 is a schematic diagram showing an FE2 filter element 1900 in accordance with an embodiment of the present invention. FE2 is the next element up in the MFE hierarchy. It is composed of a pair of FE0s 1910 and 1920, a barrel shifter 1930, an adder 1940, an accumulator 1950, and program execution hardware including an instruction (program) memory 1960, an instruction decoder 1970, and a program counter 1980. The FE2 can be configured as two independent or two cascaded FE0 filter modules or can implement an IIR filter. The FE2 has a microcode-driven architecture to allow for IIR flexibility.

The following table describes the FE2 internal registers:

| name | loc | width | Description |
|------|-----|-------|-------------|
| Rx | FE0 | [15:0] | Holds input data to be used later. |
| Ry | FE0 | [15:0] | Multiplier input A. Also writes data back to storage. |
| Rc | FE0 | [15:0] | Multiplier input B. Data is from coefficients. |
| acc | FE0 | [37:0] | Accumulation register after multiplier. Local HI/LO values. |
| acl | FE2 | [47:0] | Accumulation after shifting and addition of HI and LO values. |

The FE2 instruction memory is 32 words long with a width of 16 bits. Instruction bits [15:14] indicate the type of instruction, where [0:0] is used for setup instructions, [0:1] is used for start/stop instructions, [1:0] is used for external math instructions, and [1:1] is used for internal math instructions. Setup instructions control the configuration registers. Start instructions operate on external data and perform internal data pre-fetch. The stop instruction controls operations that occur at the end of a loop. The internal math instruction controls internal data storage and math operators. The external math instruction controls the accumulator and shifter at the FE2 top level.

Setup instructions control all of the configuration registers. Setup instructions have the following format:

|  | Bits | | | | | | | | | | | | | | | |
|---|---|---|---|---|---|---|---|---|---|---|---|---|---|---|---|---|
| mode | [15] | [14] | [13] | [12] | [11] | [10] | [9] | [8] | [7] | [6] | [5] | [4] | [3] | [2] | [1] | [0] |
| set-up | 0 | 0 | wt iir | iir | wt slv | slave | loop | on | loop n | | | offset | set | offset n | | |

The wt iir[13] and iir[12] bits are used to control IIR mode. When IIR mode is disabled (0=default), the FE0s operate using their own control registers; when IIR mode is enabled (1), the FE0s are controlled by the FC program instructions. When the value in wt iir[13] is high (1), then IIR mode is either enabled or disabled according to the value of iir[12]; when the value in wt iir [13] is low (0), then the IIR mode is unchanged.

The wt slv[11] and slave[10] bits are used to control slave mode. When slave mode is disabled (0=default), the FE2 receives external input is from a filter operating on a separate filtering function; when slave mode is enabled (1), the external input is from a linked filter operating on the same iir function so that input from a linked filter comes in from a different port, uses the xclk as an input ready signal, and is fed into the FE0s using special multiplexers. When the value in wt slv[11] is high (1), then slave mode is either enabled or disabled according to the value of slave[10]; when the value in wt slv is low (0), then slave mode is unchanged.

The loop[9], on [8], and loop n[7-5] bits are used to control looping. When the loop[9] bit is high (1), the value of the on [8] bit controls whether a loop is active (1) or inactive (0), and the value of the loop n[7-5] bits specifies the number of iterations that the loop will run, where a value of n runs the loop (n+1) times. The loop start and end address values are determined by a separate instruction (eval).

The offset[4], set[3], and offset n[2-0] bits are used to control offsets. If there is a running loop, the default offset is the current iteration of the running loop (3'h0 if there is no loop). The value of Offset_n is appended to the end of the data and the coefficient memory addresses. When Offset_n is set, by Offset_on equaling 1, then the value of Offset_n is offset n.

The write enable signal offset is used to write to the register Offset_on the signal set and Offset_n the signal offset n.

Start instructions control and operate on external input data, and also allow "pre-fetch" from the data and coefficient memories inside the FE0 filter elements. Start instructions have the following format:

|  | Bits | | | | | | | | | | | | | | | |
|---|---|---|---|---|---|---|---|---|---|---|---|---|---|---|---|---|
| mode | [15] | [14] | [13] | [12] | [11] | [10] | [9] | [8] | [7] | [6] | [5] | [4] | [3] | [2] | [1] | [0] |
| start | 0 | 1 | 0 | fd in | shift l | shift r | shift n | | | | | read | | dmrda | | cmrda |

The fd in [12] bit is used to allow external input (from the port FD) to bypass the FE0s to the shifting logic to be fed back to the FE0s on the next clock cycle. This is only used if slave mode is disabled.

Stop instructions control operations that occur at the end of a loop or IIR operation. Stop instructions have the following format:

|  | Bits | | | | | | | | | | |
|---|---|---|---|---|---|---|---|---|---|---|---|
| mode | [15] | [14] | [13] | [12] | [11] | [10] | [9] | [8] | [7]-[3] | [2] | [1] | [0] |
| stop | 0 | 1 | 1 | wait | waiton | flag | jump | eval | address | | | |

Internal math instructions control the data storage, multiplier, and accumulator internal to the FE0 modules. The following is the format of internal math instructions:

| mode | Bits | | | | | | | | | | |
|------|------|------|------|------|------|------|------|------|------|------|------|
| | [15] | [14] | [13] | [12] | [11] | [10] | [9]-[8] | [7] | [6] | [5] | [4]-[3] | [2]-[0] |
| math | 1 | 1 | rx xin | ac owt | ac pls | dm ry | dmwta | ry rx | ry dm | rc cm | dmrda | cmrda |

External math instructions control the accumulator and shifter that are external to the FE0 modules, and also allow for "pre-fetch" of memory. The following is the format of external math instructions:

| mode | Bits | | | | | | | | | | |
|------|------|------|------|------|------|------|------|------|------|------|------|
| | [15] | [14] | [13] | [12] [11] | [10] | [9]-[8] | [7] | [6] | [5] | [4]-[3] | [2]-[0] |
| ext math | 1 | 0 | a1 owt | a1 pls shift l | shift r | shift n | read | dmrda | cmrda | ext math | 1 |

An IIR filter utilizes five coefficient values plus a coefficient with value one for each second order calculation. Each group of six coefficients is stored in addresses zero through seven. The CM address mask specifies up to eight groups of coefficients. The coefficients are addressed as (offset/loop_cntr[2:0], cmrda[2:0]), i.e., the coefficients for the last stage of a sixth order IIR are contained in the address range 010000-010110. The programmer has the freedom of deciding which address within a range contains a particular coefficient. The FE2 typically finishes a basic IIR bi-quad in 15 mclk cycles, and is capable of finishing n bi-quads in 3+12n mclk cycles. For 8.8 MHz sample clock frequency, one bi-quad per FE2 can be completed within that period. For a 4.4 MHz sample clock, two bi-quads, and at a 2.2 MHz frequency, five bi-quad operations can be performed in a single FE2 unit.

Figure 20:
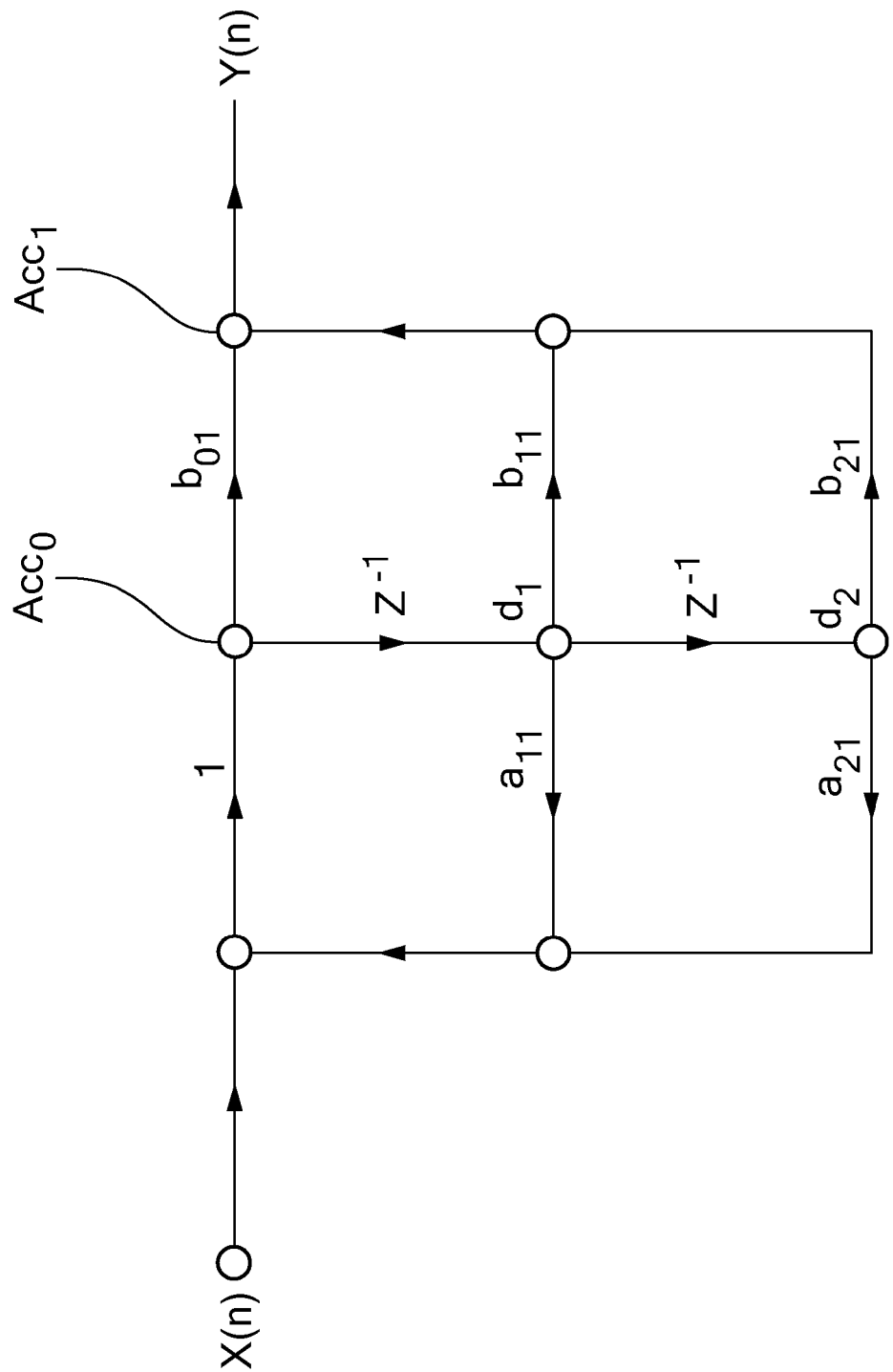
FIG. 20 is a representation of a second order infinite impulse response filter as known in the art.

The looping capability facilitates implementing IIR filters in stages of second order configuration. Each loop path executes a second order IIR filter as shown in FIG. 20.

Figure 21A:
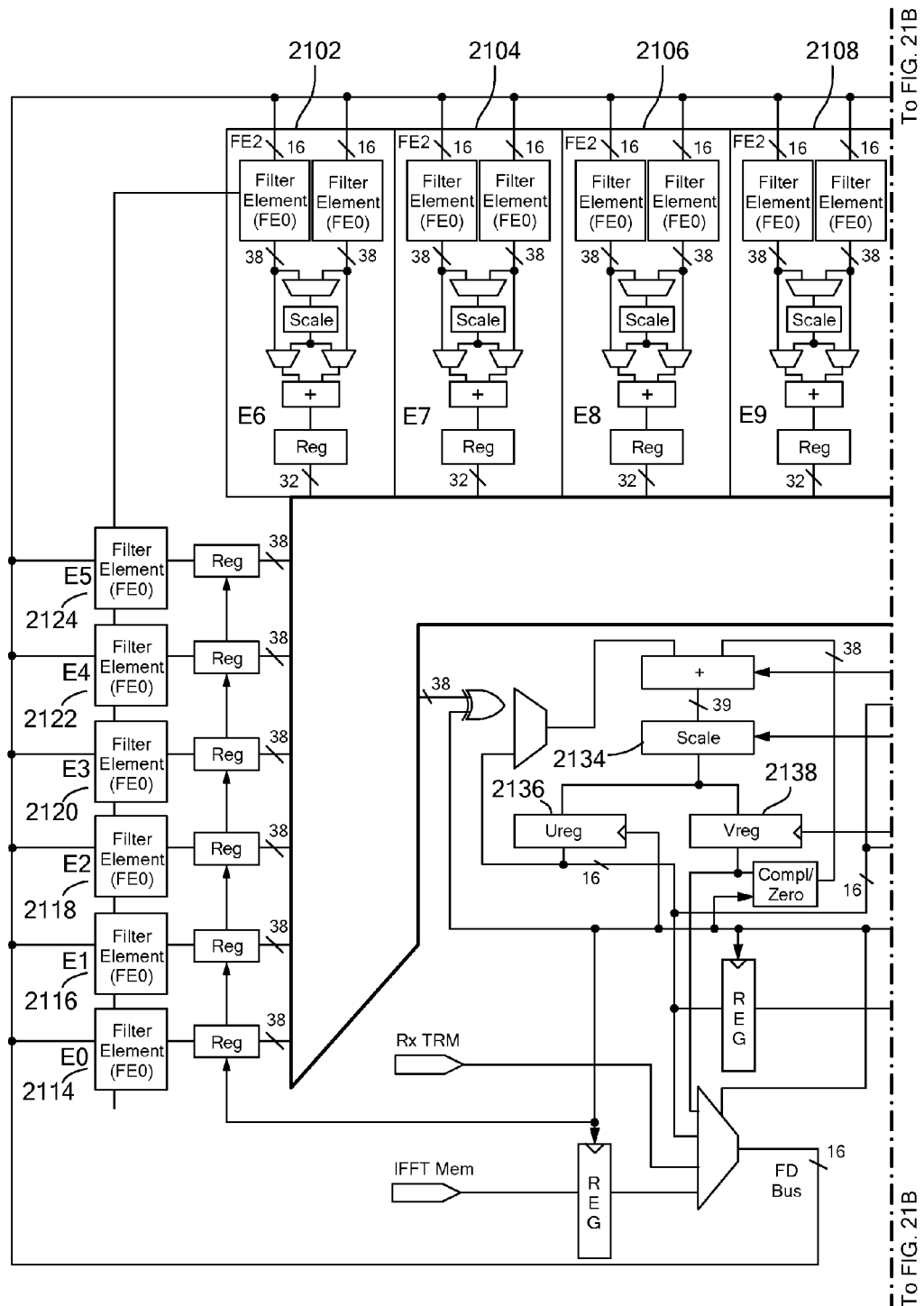
FIG. 21 is a schematic diagram showing the micro-programmable filter engine top level architecture in accordance with an embodiment of the present invention.
Figure 21B:
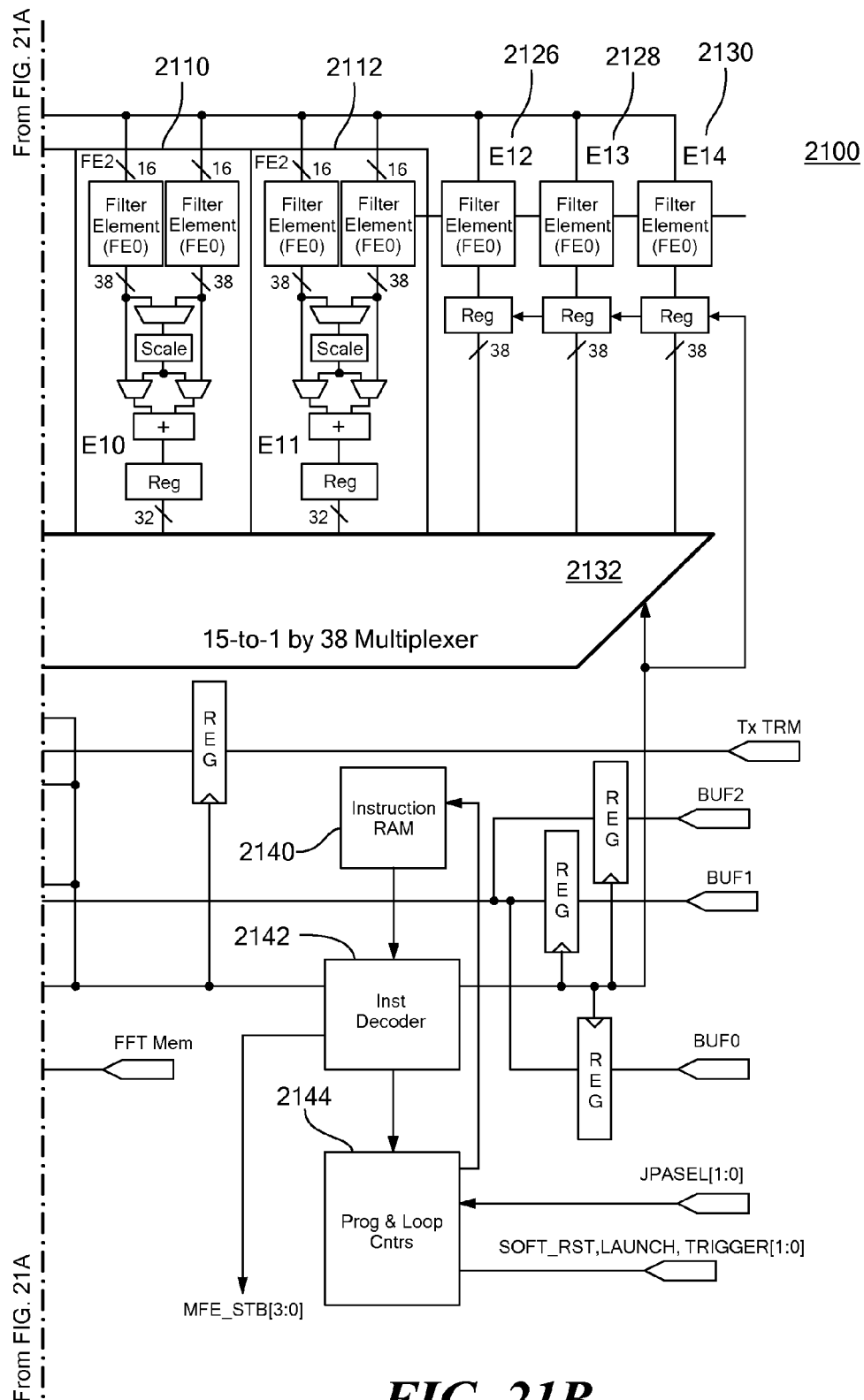

FIG. 21 is a schematic diagram showing the MFE top level architecture 2100 in accordance with an embodiment of the present invention. As discussed above, the MFE performs a set of filtering functions concurrently and provides a programmable mechanism for interconnecting these filtering functions. The top level binds together six FE2 filter elements 2102-2112 (elements E6-E11, respectively), nine separate FE0 filter elements 2114-2130 (elements E0-E5 and E12-E14, respectively), a barrel-shifter 2134, two accumulators 2136 and 2138 (referred to as Ureg and Vreg, respectively), instruction memory 2140, instruction decoder 2142, program and loop counters 2144, and various control and I/O registers (not numbered for convenience). A filter controller implementing a micro-coded program provides control for filter output data assembly, accumulation, and movement at the top level. Among other things, the MFE top level 2100 drives the symbol timing control of all FEs, provides flexible interconnect between filters, scales filter results, controls input/output, and provides master timing control for all filtering functions.

Figure 22:
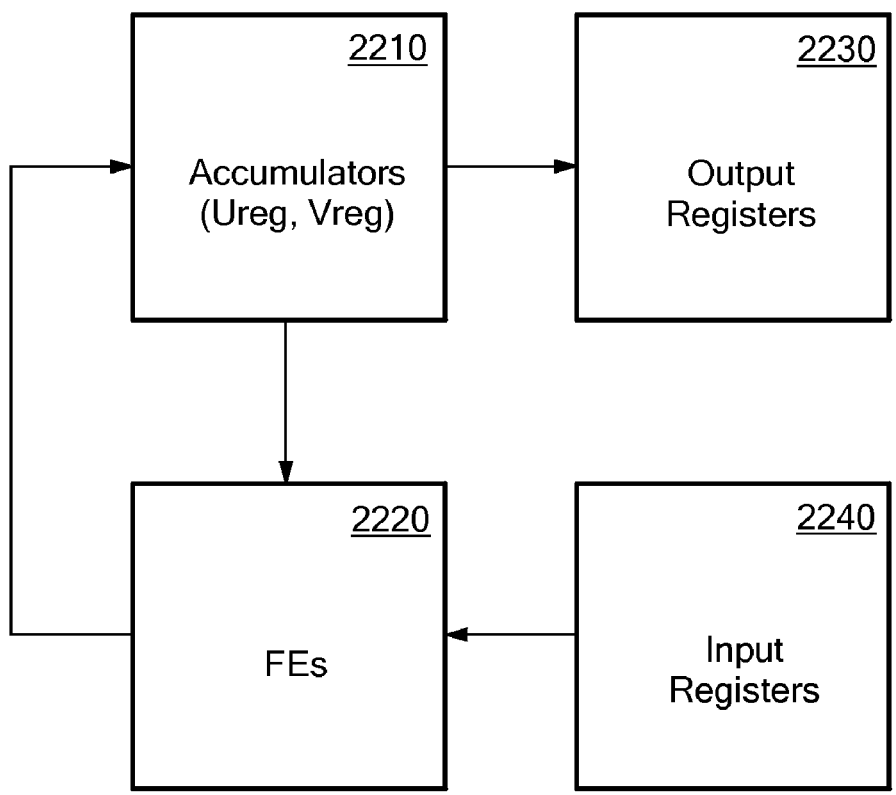
FIG. 22 shows a representation of data flows along discrete segments in the micro-programmable filter engine in accordance with an embodiment of the present invention.

FIG. 22 shows a representation of data flows along discrete segments in the micro-programmable filter engine in accordance with an embodiment of the present invention. As shown in FIG. 22, there are essentially three data flows within the MFE 2100, specifically (1) from FEs 2220 to accumulators 2210; (2) from accumulators 2210 to FEs 2220 or output registers 2230; and (3) from input registers 2240 to FEs 2220.

Thus, data flow within the MFE is geared specifically toward solving a class of problems efficiently. Similarly, the arithmetic executed in the MFE is substantially limited to accumulations and barrel-shifting and so is geared specifically toward solving a class of problems efficiently.

The MFE operates in a single zero-overhead tight loop either indefinitely or as specified by the user. Multiple code images loaded in program memory afford the engine the ability of context switching on symbol or frame boundaries, as selected by the user. Arithmetic, rounding, and scaling operations performed by the MFE have inherent overflow protection.

MFE instructions are 25 bits long. The instruction set contains dedicated fields for symbol clocks to the individual elements and a wait field to embed execution control within the instruction set.

Instruction bit 24 is the wait (Wn) field. When set, the Wn bit is an immediate execution instruction that the MFE recognizes on the next clock and causes execution of an indefinite wait following completion of executing the current instruction. This wait is terminated by assertion of the input trigger.

Instruction bits 23-20 (C3-C0, respectively) are dedicated bits for providing four soft clocks to all FEs. Each FE requires two clock rates, namely Xclk and Fclk, which are provided by these four bits C3-C0. A soft clock connection is made between one of C3-C0 to an FE's Xclk or Fclk by executing a setup instruction (CLKSET), as described below. The frequency of each clock is determined by the number of system clocks in a loop and the number of 1's and 0's in each field (C3-C0). For example, if the symbol clock rate is 64 system clocks, then the program loop length should be a multiple of 64 clocks. By placing a single 1 in one instruction at the C0 field, while keeping the same field 0 in the rest of the 63 instructions yields the correct symbol clock rate. Double the frequency is generated by setting 2 bit fields at a distance of 32 instructions apart and so on.

MFE instructions support simultaneous moves or a move plus arithmetic operation or two moves plus either a loop evaluation/jump operation. An Amove operation is from ASRC (Source A) to ADST (Destination A) and a Bmove operation is from BSRC (Source B) to BDST (Destination B).

ASRC is selected from the set {E14 ... E0}, and is encoded as shown in the Source/Destination Resources Address table below. ADST is selected from the set {Ureg (1), Vreg (0)}. BSRC is selected from the set {Ureg (10), Vreg (00), Rxtrmreg (01), IFFTreg (11)}. BDST is selected from the set {E14 ... E0, FFTreg, Txtrmreg, Ureg, Vreg}, and is encoded as shown in the Source/Destination Resources Address table below.

The MFE supports two nested loops. The outer loop is specified by an immediate jump instruction JPMOV while the inner loop is controlled with a LPMOV instruction, where the number of iterations is declared.

The following is the format of the CLR (clear) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 0 | 0 | 0 | 0 | 0 | 0 | 0 | 0 | 0 | 0 | 0 | 0 | 0 | 0 | 0 | 0 | 0 |

The CLR (clear) instruction clears all resources in the datapath.

The following is the format of the ADSTSET (destination A set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 0 | 0 | 0 | 0 | 1 | 0 | 0 | 0 | 0 | 0 | 0 | LP | EN | RS | OWR | SUB | RND |

The LP[5] bit is used to select between LPMOV and JPMOV registers that hold ADST for each instruction. Only a single ADST is assigned to each of the two instructions. The EN[4] bit is used to enable (1) the implicit ADST field for instructions LPMOV and JPMOV or disable (0) the Amove operation. The RS[3] bit is used to select Vreg (0) or Ureg (1). The OWR[2] bit is used to overwrite the selected register. The SUB[1] bit is used to subtract ASRC from the selected register (i.e., add the two's complement of ASRC to the register). The RND[0] bit is used to round the sum before storing in the selected register.

The following is the format of the FLGSET (flag set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 0 | 0 | 0 | 1 | 0 | 0 | 0 | 0 | 0 | 0 | F7 | F6 | F5 | F4 | F3 | F2 | F1 | F0 |

The FLGSET instruction is used to modify flag fields F7-F0.

The following is the format of the STBSET (strobe set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 0 | 0 | 0 | 1 | 1 | 0 | 0 | 0 | 0 | 0 | 0 | 0 | 0 | Stb3 | Stb2 | Stb1 | Stb0 |

The STBSET instruction asserts a four-bit output strobe mfe_stb[3:0] for one clock period. The strobes may be used to request data from an external resource or to signal data available. The data valid input from the resource is used to register the dataset.

The following is the format of the MODESET (mode set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 0 | 0 | 1 | 0 | 0 | 0 | 0 | 0 | 0 | 0 | 0 | 0 | 0 | x | x | TRIG1 | TRIG0 |

The MODESET instruction determines the MFE operational mode. Bits[1] and [0] are input trigger enable bits (1=enable).

The following is the format of the ARITH (arithmetic) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 1 | 0 | ASRC | ASRC | ASRC | ASRC | OWR | RND | AOP | AOP | RS | BSRC | BSRC | SCALE | SCALE | SCALE | SCALE | SCALE |

The OWR[11] bit is used to overwrite the selected register with the value in ASRC[15-12]. The RND[10] bit is used to enable rounding. The AOP[9-8] bits are used to select arithmetic operations, where 00=BSRC+ASRC, 01=BSRC−ASRC, 10=Ureg−Vreg, and 11=Ureg+Vreg. The RS[7] register select bit is used to select a destination register. The SCALE[4-0] bit are used to shift the result.

The following is the format of the CLKSET (clock set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 1 | 0 | 0 | X | X | X | X | X | X | X | ADDR | ADDR | ADDR | ADDR | ADDR | FCSEL | FCSEL | XCSEL | XCSEL |

The CLKSET instruction writes a four-bit mask register that specifies to the MFE the source of XCLK[FCLK] to the destination FE or resource addressed by the Addr field. The decoding of ADDR is per the Source/Destination Resources Address table below. Each FE has the source of its XCLK [FCLK] specified by the two-bit field in this mask. The decoding of FCSEL/XCSEL is as follows: 00=C0, 01=C1, 10=C2, 11=C3.

The following is the format of the LPSET (loop set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 0 | 1 | SI | SC | X | X | LPLEN | LPLEN | LPLEN | LPLEN | LPLEN | LPLEN | LPLEN | LPLEN | LPLEN | LPLEN | LPLEN | LPLEN |

The LPSET instruction sets up loop control. The SI[15] bit is used to start an indefinite zero-overhead loop whose end is marked with a LPMOV instruction. An indefinite loop returns to the instruction that follows a LPSET. The SC[14] bit is used to start a loop that repeats LPLEN[11-0] times, whose end is marked with a LPMOV instruction.

The following is the format of the JPSET (jump set) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 0 | 1 | 1 | SEL | | X | X | X | X | | | | JPADDR | | | | | | |

The JPSET instruction defines the next instruction address when a JPMOV is executed at JPADDR. The SEL[15-14] bits provide the register address to which the Jump Address is written. The encoding of this field is as follows: 00=JPA0 (Default), 01=JPA1, 10=JPA2, 11=JPA3. The JPADDR[9-0] bits are the physical address.

The following is the format of the JPMOV (jump move) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 1 | 1 | 0 | ASRC | | | | BDST | | | | BSRC | | | | SCALE | | | |

The JPMOV instruction is typically the next-to-last instruction in the main loop. Two move operations and an immediate jump to address JPADDR are executed. The ADST field is defined by instruction ADSTSET, which generally must be executed prior to this instruction. The Bmove source BSRC is limited to Ureg (when 1) and Vreg (when 0). BDST is defined in the Source/Destination Resources Address table. A Bmove can move data from Ureg to Vreg but not the reverse. The SCALE field allows scaling to be performed by selecting specified output bits. The SCALE field is encoded according to the Barrel Shift table below. The scale operation applies to the Amove only.

The following is the format of the LPMOV (loop move) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| Wn | C3 | C2 | C1 | C0 | 0 | 1 | 1 | 1 | ASRC | | | | BDST | | | | BSRC | | | | SCALE | | | |

The LPMOV instruction is typically the next-to-last instruction in an inner loop with a finite number of iterations. Two move operations and an immediate jump to instruction that follows a LPSET are executed. The ADST field is defined by instruction ADSTSET, which generally must be executed prior to this instruction. The Bmove source BSRC is limited to Ureg (when 1) and Vreg (when 0). BDST is defined in the Source/Destination Resources Address table. A Bmove can move data from Ureg to Vreg but not the reverse. The SCALE field allows scaling to be performed by selecting specified output bits. The SCALE field is encoded according to the Barrel Shift table below. The scale operation applies to the Amove only.

The following is the format of the MOV (move) instruction for an exemplary embodiment of the present invention:

| 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|---|---|---|---|---|---|---|---|---|---|
| Wn | C3 | C2 | C1 | C0 | 1  | ADST |  |  | ASRC |  |  |  | BDST |  |  |  | BSRC |  |  |  | SCALE |  |  |  |

The MOV instruction moves data from ASRC to ADST with scaling applied simultaneously with a move from BSRC to BDST. The Amove is not executed if ASRC=0x0F (i.e., hexadecimal 0F). Similarly, the Bmove is not executed if the BDST=0x1F. The ADST field includes three bits, namely the OWR[18] overwrite bit, the RS[17] register select bit, and the Round[16] bit. The SCALE field allows scaling to be performed by selecting specified output bits. The SCALE field is encoded according to the Barrel Shift table below.

The following is the Barrel Shift table used for scaling, as discussed above:

| Scale Field | Selected bits out |
|-------------|-------------------|
| 00000 | 37:22 |
| 00001 | 36:21 |
| 00010 | 35:20 |
| 00011 | 34:19 |
| 00100 | 33:18 |
| 00101 | 32:17 |
| 00110 | 31:16 |
| 00111 | 30:15 |
| 01000 | 29:14 |
| 01001 | 28:13 |
| 01010 | 27:12 |
| 01011 | 26:11 |
| 01100 | 25:10 |
| 01101 | 24:9 |
| 01110 | 23:8 |
| 01111 | 22:7 |
| 10000 | 21:6 |
| 10001 | 20:5 |
| 10010 | 19:4 |
| 10011 | 18:3 |
| 10100 | 17:2 |
| 10101 | 16:1 |
| 10110 | 15:0 |

The following is the Source/Destination Resources Address table used for addressing, as discussed above:

| Address | Resource |
|---------|----------|
| 00000 | E0 |
| 00001 | E1 |
| 00010 | E2 |
| 00011 | E3 |
| 00100 | E4 |
| 00101 | E5 |
| 00110 | E6-L |
| 00111 | E7-L |
| 01000 | E8-L |
| 01001 | E9-L |
| 01010 | E10-L |
| 01011 | E11-L |
| 01100 | E12 |
| 01101 | E13 |
| 01110 | E14 |
| 01111 | None |
| 10000 | RX-TRM |
| 10001 | TX-TRM |
| 10010 | FFT_MEM |
| 10011 | IFFT_MEM |
| 10100 | RxClk_out |
| 10101 |  |
| 10110 | E6-H |
| 10111 | E7-H |
| 11000 | E8-H |
| 11001 | E9-H |
| 11010 | E10-H |
| 11011 | E11-H |
| 11100 | BUF0 |
| 11101 | BUF1 |
| 11110 | BUF2 |
| 11111 | None |

The following is an exemplary address map for the MFE 2100. With reference to FIG. 21, FE0_0 to FE0_8 are mapped to the instantiations E0-E5 and E12-E14, while FE2_9 to FE2_14 are mapped to the instantiations E6-E11.

FE0_0

| DMA access | | | |
|---|---|---|---|
| Address Range | | RAM | 15-0 |
| 03000 | 030BC | DM | dpreg64x16 Data Memory |
| 03100 | 031BC | CM | spreg64x16 Coefficient Memory |

| | | CRB access | | | | | | | | |
|---|---|---|---|---|---|---|---|---|---|---|
| Address Range | Register | 15–10 | 9 | 8 | 7 | 6 | 5 | 4 | 3 | 2 | 1–0 |
| 07980 | cfg_ctl |  | slave | int | dec | rxi | go | sym | byp | cms | rci |
| 07984 | lp0_ctl |  |  |  |  |  |  |  | lp0cnt |  |  |
| 07988 | lp1_ctl |  |  | on | up |  |  |  | lp1_base |  |  |
| 0798C | INIT |  |  |  |  |  |  |  | INIT |  |  |
| 07990 | INCR |  |  |  |  |  |  |  | INCR |  |  |
| 07994 | int_ctl |  |  |  |  | ectl |  |  | ip_fval |  |  |

FE0_1:

DMA access

| Address Range | | RAM | 15-0 |
|---|---|---|---|
| 03200 | 032BC | DM | dpreg64x16 Data Memory |
| 03300 | 033BC | CM | spreg64x16 Coefficient Memory |

CRB access

| Address Range | Register | 15–10 | 9 | 8 | 7 | 6 | 5 | 4 | 3 | 2 | 1–0 |
|---|---|---|---|---|---|---|---|---|---|---|---|
| 079A0 | cfg_ctl | | slave | int | dec | rxi | go | sym | byp | cms | rci |
| 079A4 | lp0_ctl | | | | | | | | lp0cnt | | |
| 079A8 | lp1_ctl | | | | on | up | | | lp1_base | | |
| 079AC | INIT | | | | | | | | INIT | | |
| 079B0 | INCR | | | | | | | | INCR | | |
| 079B4 | int_ctl | | | | | etcl | | | ip_fval | | |

FE0_2:

DMA access

| Address Range | | RAM | 15-0 |
|---|---|---|---|
| 03400 | 034BC | DM | dpreg64x16 Data Memory |
| 03500 | 035BC | CM | spreg64x16 Coefficient Memory |

CRB access

| Address Range | Register | 15–10 | 9 | 8 | 7 | 6 | 5 | 4 | 3 | 2 | 1–0 |
|---|---|---|---|---|---|---|---|---|---|---|---|
| 079C0 | cfg_ctl | | slave | int | dec | rxi | go | sym | byp | cms | rci |
| 079C4 | lp0_ctl | | | | | | | | lp0cnt | | |
| 079C8 | lp1_ctl | | | | on | up | | | lp1_base | | |
| 079CC | INIT | | | | | | | | INIT | | |
| 079D0 | INCR | | | | | | | | INCR | | |
| 079D4 | int_ctl | | | | | ectl | | | ip_fval | | |

FE0_3:

DMA access

| Address Range | | RAM | 15-0 |
|---|---|---|---|
| 03600 | 036BC | DM | dpreg64x16 Data Memory |
| 03700 | 037BC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | CRB access | | | | | | |
| 079E0 | cfg_ctl | | slave | int | dec | rxi | go | sym | byp | cms | rci |
| 079E4 | lp0_ctl | | | | | | | | lp0cnt | | |
| 079E8 | lp1_ctl | | | | on | up | | | lp1_base | | |
| 079EC | INIT | | | | | | | | INIT | | |
| 079F0 | INCR | | | | | | | | INCR | | |
| 079F4 | int_ctl | | | | | ectl | | | ip_fval | | |

FE0_4:

| Address Range | | RAM | 15-0 |
|---|---|---|---|
| | | DMA access | |
| 03800 | 038BC | DM | dpreg64x16 Data Memory |
| 03900 | 039BC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | CRB access | | | | | | |
| 07A00 | cfg_ctl | | slave | int | dec | rxi | go | sym | byp | cms | rci |
| 07A04 | lp0_ctl | | | | | | | | lp0cnt | | |
| 07A08 | lp1_ctl | | | | on | up | | | lp1_base | | |
| 07A0C | INIT | | | | | | | | INIT | | |
| 07A10 | INCR | | | | | | | | INCR | | |
| 07A14 | int_ctl | | | | | ectl | | | ip_fval | | |

FE0_5:

| Address Range | | RAM | 15-0 |
|---|---|---|---|
| | | DMA access | |
| 03A00 | 03ABC | DM | dpreg64x16 Data Memory |
| 03B00 | 03BBC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | CRB access | | | | | | |
| 07A20 | cfg_ctl | | slave | int | dec | rxi | go | sym | byp | cms | rci |
| 07A24 | lp0_ctl | | | | | | | | lp0cnt | | |
| 07A28 | lp1_ctl | | | | on | up | | | lp1_base | | |
| 07A2C | INIT | | | | | | | | INIT | | |
| 07A30 | INCR | | | | | | | | INCR | | |
| 07A34 | int_ctl | | | | | ectl | | | ip_fval | | |

FE0_6:

| Address Range | | RAM | DMA access 15-0 |
|---|---|---|---|
| 03C00 | 03CBC | DM | dpreg64x16 Data Memory |
| 03D00 | 03DBC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | | CRB access | | | | | |
| 07A40 | cfg_ctl | | slave | int | dec | rxi | go | sym | byp | cms | rci |
| 07A44 | lp0_ctl | | | | | | | | lp0cnt | | |
| 07A48 | lp1_ctl | | | | on | up | | | lp1_base | | |
| 07A4C | INIT | | | | | | | | INIT | | |
| 07A50 | INCR | | | | | | | | INCR | | |
| 07A54 | int_ctl | | | | | ectl | | | ip_fval | | |

FE0_7:

| Address Range | | RAM | DMA access 15-0 |
|---|---|---|---|
| 03E00 | 03EBC | DM | dpreg64x16 Data Memory |
| 03F00 | 03FBC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | | CRB access | | | | | |
| 07A60 | cfg_ctl | | slave | int | dec | rxi | go | sym | byp | cms | rci |
| 07A64 | lp0_ctl | | | | | | | | lp0cnt | | |
| 07A68 | lp1_ctl | | | | on | up | | | lp1_base | | |
| 07A6C | INIT | | | | | | | | INIT | | |
| 07A70 | INCR | | | | | | | | INCR | | |
| 07A74 | int_ctl | | | | | ectl | | | ip_fval | | |

FE0_8:

| Address Range | | RAM | DMA access 15-0 |
|---|---|---|---|
| 04000 | 040BC | DM | dpreg64x16 Data Memory |
| 04100 | 041BC | CM | spreg64x16 Coefficient Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | CRB access | | | | | | | |
| 07A80 | cfg_ctl | | slave | int | dec | rxi | go | sym | byp | cms | rci |
| 07A84 | lp0_ctl | | | | | | | | lp0cnt | | |
| 07A88 | lp1_ctl | | | | on | up | | | lp1_base | | |
| 07A8C | INIT | | | | | | | | INIT | | |
| 07A90 | INCR | | | | | | | | INCR | | |
| 07A94 | int_ctl | | | | | ectl | | | ip_fval | | |

FE2_9:

| Address Range | RAM | 15–0 | | |
|---|---|---|---|---|
| | | DMA access | | |
| 00000 | 000BC | DM0 | dpreg64 × 16 | Data Memory |
| 00100 | 001BC | CM0 | spreg64 × 16 | Coefficient Memory |
| 00200 | 002BC | DM1 | dpreg64 × 16 | Data Memory |
| 00300 | 003BC | CM1 | spreg64 × 16 | Coefficient Memory |
| 00400 | 0043C | PM | spreg32 × 12 | Program Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | CRB access | | | | | | | |
| 07AA0 | cfg_ctl | | slave | int | dec | rxi | go | sym | byp | cms | rci |
| 07AA4 | lp0_ctl | | | | | | | | lp0cnt | | |
| 07AA8 | lp1_ctl | | | | on | up | | | lp1_base | | |
| 07AAC | INIT | | | | | | | | INIT | | |
| 07AB0 | INCR | | | | | | | | INCR | | |
| 07AB4 | int_ctl | | | | | ectl | | | ip_fval | | |

FE2_10:

| Address Range | RAM | 15–0 | | |
|---|---|---|---|---|
| | | DMA access | | |
| 00800 | 008BC | DM0 | dpreg64 × 16 | Data Memory |
| 00900 | 009BC | CM0 | spreg64 × 16 | Coefficient Memory |
| 00A00 | 00ABC | DM1 | dpreg64 × 16 | Data Memory |
| 00B00 | 00BBC | CM1 | spreg64 × 16 | Coefficient Memory |
| 00C00 | 00C3C | PM | spreg32 × 12 | Program Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | CRB access | | | | | | | |
| 07840 | cfg_ctl0 | | slave | int | dec | rxi | go | sym | byp | cms | rci |
| 07844 | lp0_ctl0 | | | | | | | | lp0cnt | | |
| 07848 | lp1_ctl0 | | | | on | up | | | lp1_base | | |
| 0784C | INIT0 | | | | | | | | INIT | | |
| 07850 | INCR0 | | | | | | | | INCR | | |
| 07854 | int_ctl0 | | | | | ectl | | | ip_fval | | |

-continued

CRB access

| Address Range | Register | 15–10 | 9 | 8 | 7 | 6 | 5 | 4 | 3 | 2 | 1–0 |
|---|---|---|---|---|---|---|---|---|---|---|---|
| 07860 | cfg_ctl1 | | slave | int | dec | rxi | go | sym | byp | cms | rci |
| 07864 | lp0_ctl1 | | | | | | | | lp0cnt | | |
| 07868 | lp1_ctl1 | | | | on | up | | | lp1_base | | |
| 0786C | INIT1 | | | | | | | | INIT | | |
| 07870 | INCR11 | | | | | | | | INCR | | |
| 07874 | int_ctl1 | | | | | ectl | | | ip_fval | | |

FE2_11:

DMA access

| Address Range | | RAM | 15–0 |
|---|---|---|---|
| 01000 | 010BC | DM0 | dpreg64 × 16 Data Memory |
| 01100 | 011BC | CM0 | spreg64 × 16 Coefficient Memory |
| 01200 | 012BC | DM1 | dpreg64 × 16 Data Memory |
| 01300 | 013BC | CM1 | spreg64 × 16 Coefficient Memory |
| 01400 | 0143C | PM | spreg32 × 12 Program Memory |

CRB access

| Address Range | Register | 15–10 | 9 | 8 | 7 | 6 | 5 | 4 | 3 | 2 | 1–0 |
|---|---|---|---|---|---|---|---|---|---|---|---|
| 07880 | cfg_ctl0 | | slave | int | dec | rxi | go | sym | byp | cms | rci |
| 07884 | lp0_ctl0 | | | | | | | | lp0cnt | | |
| 07888 | lp1_ctl0 | | | | on | up | | | lp1_base | | |
| 0788C | INIT0 | | | | | | | | INIT | | |
| 07890 | INCR0 | | | | | | | | INCR | | |
| 07894 | int_ctl0 | | | | | ectl | | | ip_fval | | |
| 078A0 | cfg_ctl1 | | slave | int | dec | rxi | go | sym | byp | cms | rci |
| 078A4 | lp0_ctl1 | | | | | | | | lp0cnt | | |
| 078A8 | lp1_ctl1 | | | | on | up | | | lp1_base | | |
| 078AC | INIT1 | | | | | | | | INIT | | |
| 078B0 | INCR11 | | | | | | | | INCR | | |
| 078B4 | int_ctl1 | | | | | ectl | | | ip_fval | | |

FE2_12:

DMA access

| Address Range | | RAM | 15–0 |
|---|---|---|---|
| 01800 | 018BC | DM0 | dpreg64 × 16 Data Memory |
| 01900 | 019BC | CM0 | spreg64 × 16 Coefficient Memory |
| 01A00 | 01ABC | DM1 | dpreg64 × 16 Data Memory |
| 01B00 | 01BBC | CM1 | spreg64 × 16 Coefficient Memory |
| 01C00 | 01C3C | PM | spreg32 × 12 Program Memory |

CRB access

| Address Range | Register | 15–10 | 9 | 8 | 7 | 6 | 5 | 4 | 3 | 2 | 1–0 |
|---|---|---|---|---|---|---|---|---|---|---|---|
| 078C0 | cfg_ctl0 | | slave | int | dec | rxi | go | sym | byp | cms | rci |
| 078C4 | lp0_ctl0 | | | | | | | | lp0cnt | | |

-continued

CRB access

| Address Range | Register | 15–10 | 9 | 8 | 7 | 6 | 5 | 4 | 3 | 2 | 1–0 |
|---|---|---|---|---|---|---|---|---|---|---|---|
| 078C8 | lp1_ctl0 | | | on | up | | | | lp1_base | | |
| 078CC | INIT0 | | | | | | | | INIT | | |
| 078D0 | INCR0 | | | | | | | | INCR | | |
| 078D4 | int_ctl0 | | | | ectl | | | | ip_fval | | |
| 078E0 | cfg_ctl1 | | slave | int | dec | rxi | go | sym | byp | cms | rci |
| 078E4 | lp0_ctl1 | | | | | | | | lp0cnt | | |
| 078E8 | lp1_ctl1 | | | on | up | | | | lp1_base | | |
| 078EC | INIT1 | | | | | | | | INIT | | |
| 078F0 | INCR11 | | | | | | | | INCR | | |
| 078F4 | int_ctl1 | | | | ectl | | | | ip_fval | | |

FE2_13:

DMA access

| Address Range | | RAM | 15–0 |
|---|---|---|---|
| 02000 | 020BC | DM0 | dpreg64 × 16 Data Memory |
| 02100 | 021BC | CM0 | spreg64 × 16 Coefficient Memory |
| 02200 | 022BC | DM1 | dpreg64 × 16 Data Memory |
| 02300 | 023BC | CM1 | spreg64 × 16 Coefficient Memory |
| 02400 | 0243C | PM | spreg32 × 12 Program Memory |

CRB access

| Address Range | Register | 15–10 | 9 | 8 | 7 | 6 | 5 | 4 | 3 | 2 | 1–0 |
|---|---|---|---|---|---|---|---|---|---|---|---|
| 07900 | cfg_ctl0 | | slave | int | dec | rxi | go | sym | byp | cms | rci |
| 07904 | lp0_ctl0 | | | | | | | | lp0cnt | | |
| 07908 | lp1_ctl0 | | | on | up | | | | lp1_base | | |
| 0790C | INIT0 | | | | | | | | INIT | | |
| 07910 | INCR0 | | | | | | | | INCR | | |
| 07914 | int_ctl0 | | | | ectl | | | | ip_fval | | |
| 07920 | cfg_ctl1 | | slave | int | dec | rxi | go | sym | byp | cms | rci |
| 07924 | lp0_ctl1 | | | | | | | | lp0cnt | | |
| 07928 | lp1_ctl1 | | | on | up | | | | lp1_base | | |
| 0792C | INIT1 | | | | | | | | INIT | | |
| 07930 | INCR11 | | | | | | | | INCR | | |
| 07934 | int_ctl1 | | | | ectl | | | | ip_fval | | |

FE2_14:

DMA access

| Address Range | | RAM | 15–0 |
|---|---|---|---|
| 02800 | 028BC | DM0 | dpreg64 × 16 Data Memory |
| 02900 | 029BC | CM0 | spreg64 × 16 Coefficient Memory |
| 02A00 | 02ABC | DM1 | dpreg64 × 16 Data Memory |
| 02B00 | 02BBC | CM1 | spreg64 × 16 Coefficient Memory |
| 02C00 | 02C3C | PM | spreg32 × 12 Program Memory |

| Address Range | Register | 15–10 | 9 | 8 | 7 | 6 | 5 | 4 | 3 | 2 | 1–0 |
|---|---|---|---|---|---|---|---|---|---|---|---|
| | | | | | CRB access | | | | | | |
| 07940 | cfg_ctl0 | | slave | int | dec | rxi | go | sym | byp | cms | rci |
| 07944 | lp0_ctl0 | | | | | | lp0cnt | | | | |
| 07948 | lp1_ctl0 | | | | on | up | lp1_base | | | | |
| 0794C | INIT0 | | | | | | INIT | | | | |
| 07950 | INCR0 | | | | | | INCR | | | | |
| 07954 | int_ctl0 | | | | | ectl | ip_fval | | | | |
| 07960 | cfg_ctl1 | | slave | int | dec | rxi | go | sym | byp | cms | rci |
| 07964 | lp0_ctl1 | | | | | | lp0cnt | | | | |
| 07968 | lp1_ctl1 | | | | on | up | lp1_base | | | | |
| 0796C | INIT1 | | | | | | INIT | | | | |
| 07970 | INCR11 | | | | | | INCR | | | | |
| 07974 | int_ctl1 | | | | | ectl | ip_fval | | | | |

Because the MFE is programmable, various filter configuration profiles can be pre-defined for use with various respective line conditions, and the MFE can be programmed with an appropriate configuration profile based on actual or expected line conditions. Each configuration profile can define such things as the type(s) of filters, the topology of the filters (i.e., where in the path the filtering gets done), and the filter parameters. Line conditions, such as echoes, noise, and frequency response, can be characterized, for example, using line probing or other active and/or passive characterization techniques. The appropriate configuration profile can be selected based on the results of the characterization.

It should be noted that the following claims may use the term "at least one" to indicate the inclusion of one or more of a particular element, but the omission of that term from a particular claim element is not to be construed as a limitation to just one of that element.

The present invention may be embodied in other specific forms without departing from the true scope of the invention. The described embodiments are to be considered in all respects only as illustrative and not restrictive.

What is claimed is:

1. A micro-programmable filter engine comprising:
a first plurality of programmable filter elements interconnected in a chain configuration, each filter element having a first data input and a first data output, the first data input coupled to the first data output of a previous filter element in the chain, the first data output coupled to the first data input of a next filter element in the chain, each filter element also having a second data input and a second data output, at least one of said first plurality of programmable filter elements having a first microcode control program for internal control of the programmable filter element;
first programmable interconnection logic coupled to the second data inputs and outputs of the first plurality of programmable filter elements for selectively combining, scaling, and accumulating output values received from the first plurality of programmable filter elements and selectively providing accumulated values as inputs to the first plurality of programmable filter elements; and
a first filter controller coupled to the first plurality of programmable filter elements and the first programmable interconnection logic, the first filter controller having a second microcode control program for external control of the first plurality of programmable filter elements and the first programmable interconnection logic, whereby the micro-programmable filter engine supports implementation of multiple filters formed from one or more filter elements.

2. A micro-programmable filter engine according to claim 1, wherein the first filter controller comprises:
an instruction memory for storing the second control program; and
at least one instruction decoder coupled to the instruction memory for programming the first plurality of programmable filter elements and the first programmable interconnection logic based on the second control program.

3. A micro-programmable filter engine according to claim 1, wherein the first filter controller further comprises a plurality of program counters for running different iterations of the second control program for different filter elements.

4. A micro-programmable filter engine according to claim 1, wherein the first filter controller further comprises a plurality of loop counters for running different iterations of second control program loops for different filter elements.

5. A micro-programmable filter engine according to claim 1, wherein the first programmable interconnection logic comprises:
a multiplexer coupled to the first plurality of programmable filter elements for selectively driving output values received from the first plurality of programmable filter elements;
a barrel shifter coupled to the multiplexer for receiving the values and selectively scaling the values according to a scaling factor programmed by the first filter controller; and
at least one accumulator coupled to the barrel shifter for selectively accumulating scaled values from the barrel shifter.

6. A micro-programmable filter engine according to claim 5, wherein the first programmable interconnection logic further comprises:
programmable feedback logic coupled to the at least one accumulator and to the second data inputs of the first plurality of filter elements for selectively providing the accumulated values as inputs to the first plurality of programmable filter elements.

7. A micro-programmable filter engine according to claim 1, wherein at least one programmable filter element having a first microcode control program comprises:
a second plurality of programmable filter elements;
second programmable interconnection logic coupled to the second plurality of programmable filter elements for selectively combining, scaling, and accumulating output values received from the second plurality of programmable filter elements and selectively providing accumulated values as inputs to the second plurality of programmable filter elements; and a second filter controller coupled to the second plurality of programmable filter elements and the second programmable interconnection logic for controlling the second plurality of programmable filter elements and the second programmable interconnection logic according to the first control program.

8. A micro-programmable filter engine according to claim 1, wherein at least one of the first plurality of programmable filter elements comprises:

at least one memory for storing data samples and coefficients;

a multiplier for multiplying data samples read from the at least one memory with corresponding coefficients read from the at least one memory;

an accumulator for summing multiplier outputs; and control logic for controlling the at least one memory, the multiplier, and the accumulator, the control logic logically shifting the data samples read from the at least one memory and writing the logically shifted data samples back into the at least one memory so as to emulate a shift register.

9. A micro-programmable filter engine according to claim 1, wherein the first filter controller allows each programmable filter element to operate independently to perform different filtering functions.

10. A micro-programmable filter engine according to claim 1, wherein the first filter controller allows operation of multiple programmable filter elements to be combined to perform a single filtering function.

11. A micro-programmable filter engine according to claim 1, wherein the first filter controller can implement a plurality of filters, each having a symbol rate, and wherein the repetitive execution, by the first filter controller, of a loop containing a number of single-clock instructions can be completed in the number of clocks that are required for execution of a symbol for the filter having the slowest symbol rate.

12. A micro-programmable filter engine according to claim 11, wherein, during each symbol period of the slowest symbol rate filter, filters with faster symbol rates than the slowest symbol rate filter can operate on multiple symbols.

13. A micro-programmable filter engine according to claim 11, wherein, during each symbol period of the slowest symbol rate filter, filters with faster symbol rates than the slowest symbol rate filter can complete execution of a symbol and then remain idle for the remainder of the symbol period.

14. A micro-programmable filter engine according to claim 1, wherein each microcode instruction in the instruction set of the first filter controller contains a clock field, and wherein the first filter controller applies software-generated clocks to the individual filter elements based on the clock field.

15. A micro-programmable filter engine according to claim 14, wherein a software-controlled clock can be generated by programming a value of one or zero in the clock field in each microcode instruction, such that the sequence of ones and zeros directly generate a plurality of symbol clocks at a frequency dictated by the sequence and the length of instruction loop.

16. A micro-programmable filter engine according to claim 1, wherein symbol clocks applied to the plurality of filter elements are dynamically selected via software and the frequencies are determined by a field in the instruction set of the first filter controller.

17. A micro-programmable filter engine according to claim 1, wherein each microcode instruction of the instruction set of the first filter controller contains a loop evaluation bit, and wherein the first filter controller evaluates the loop evaluation bit during the execution of each instruction.

18. Apparatus for digital filtering comprising:

a first plurality of programmable filter elements interconnected in a chain configuration, at least one of said first plurality of programmable filter elements having a first microcode control program for internal control of the programmable filter element;

first means for programming the first plurality of programmable filter elements based on a second microcode control program; and first means for selectively combining, scaling, and accumulating output values received from the first plurality of programmable filter elements and for selectively providing accumulated values as inputs to the first plurality of programmable filter elements, whereby the apparatus supports implementation of multiple filters formed from one or more filter elements.

19. Apparatus according to claim 18, wherein the first means for programming the first plurality of programmable filter elements based on a second microcode control program comprises:

an instruction memory for storing the second control program; and means for decoding the second control program for programming the first plurality of programmable filter elements and the first programmable interconnection logic based on the second control program.

20. Apparatus according to claim 18, wherein the first means for programming the first plurality of programmable filter elements based on a second microcode control program further comprises means for running different iterations of the second control program for different filter elements.

21. Apparatus according to claim 18, wherein the first means for programming the first plurality of programmable filter elements based on a second microcode control program further comprises means for running different iterations of second control program loops for different filter elements.

22. Apparatus according to claim 18, wherein the first means for selectively combining, scaling, and accumulating output values received from the first plurality of programmable filter elements and for selectively providing accumulated values as inputs to the first plurality of programmable filter elements comprises:

means for selectively outputting values received from the first plurality of programmable filter elements;

means for receiving the outputted values and selectively scaling the outputted values according to a pre-programmed scaling factor; and means for selectively accumulating scaled values.

23. Apparatus according to claim 22, wherein the first means for selectively combining, scaling, and accumulating output values received from the first plurality of programmable filter elements and for selectively providing accumulated values as inputs to the first plurality of programmable filter elements further comprises:

means for selectively providing the accumulated values as inputs to the first plurality of programmable filter elements.

24. Apparatus according to claim 18, wherein at least one programmable filter element having a first microcode control program comprises:
 a second plurality of programmable filter elements;
 second means for programming the second plurality of programmable filter elements based on the first microcode control program; and
second means selectively combining, scaling, and accumulating output values received from the second plurality of programmable filter elements and selectively providing accumulated values as inputs to the second plurality of programmable filter elements.

25. Apparatus according to claim 18, wherein at least one of the first plurality of programmable filter elements comprises:
 at least one memory for storing data samples and coefficients;
 means for combining data samples read from the at least one memory with corresponding coefficients read from the at least one memory; and
means for logically shifting the data samples read from the at least one memory and writing the logically shifted data samples back into the at least one memory so as to emulate a shift register.

26. Apparatus according to claim 18, wherein the first means for programming the first plurality of programmable filter elements based on a second microcode control program comprises:
 means for each programmable filter element to operate independently to perform different filtering functions.

27. Apparatus according to claim 18, wherein the first means for programming the first plurality of programmable filter elements based on a second microcode control program comprises:
 means for allowing operation of multiple programmable filter elements to be combined to perform a single filtering function.

28. Apparatus according to claim 18, wherein the first means for programming the first plurality of programmable filter elements based on a second microcode control program comprises:
 means for implementing a plurality of filters, each having a symbol rate, wherein the repetitive execution of a loop containing a number of single-clock instructions can be completed in the number of clocks that are required for execution of a symbol for the filter having the slowest symbol rate.

29. Apparatus according to claim 28, wherein the means for implementing a plurality of filters comprises:
 means for operating on multiple symbols, during each symbol period of the slowest symbol rate filter, for filters with faster symbol rates than the slowest symbol rate filter.

30. Apparatus according to claim 28, wherein the means for implementing a plurality of filters comprises:
 means for completing execution of a symbol and then remaining idle for the remainder of the symbol period, during each symbol period of the slowest symbol rate filter, for filters with faster symbol rates than the slowest symbol rate filter.

31. Apparatus according to claim 18, wherein the first means for programming the first plurality of programmable filter elements based on a second microcode control program comprises:
 means for applying software-generated clocks to the individual filter elements based on a clock field in each microcode instruction.

32. Apparatus according to claim 31, wherein a software-controlled clock can be generated by programming a value of one or zero in the clock field in each microcode instruction, such that the sequence of ones and zeros directly generate a plurality of symbol clocks at a frequency dictated by the sequence and the length of instruction loop.

33. Apparatus according to claim 18, wherein the symbol clocks applied to the plurality of filter elements are dynamically selected via software and the frequencies are determined by a field in the instruction set of the first filter controller.

34. Apparatus according to claim 18, wherein each microcode instruction contains a loop evaluation bit, and wherein the loop evaluation bit is evaluated during the execution of each instruction.

35. A micro-programmable filter engine according to claim 1, wherein the first plurality of programmable filter elements are configurable to perform at least one of: finite impulse response (FIR) filtering, infinite impulse response (IIR) filtering, echo cancellation, decimation, and interpolation.

36. A micro-programmable filter engine according to claim 7, wherein the second plurality of programmable filter elements are configurable to perform at least one of: finite impulse response (FIR) filtering, infinite impulse response (IIR) filtering, echo cancellation, decimation, and interpolation.

37. A micro-programmable filter engine according to claim 1, wherein the first plurality of programmable filter elements are operably coupled to a transceiver for at least one of processing communication signals provided by the transceiver and providing processed signals to the transceiver.

38. A micro-programmable filter engine according to claim 37, wherein the transceiver is a digital subscriber line transceiver.

39. A micro-programmable filter engine according to claim 37, wherein the communication signals provided by the transceiver include digitized data samples.

40. A micro-programmable filter engine according to claim 37, wherein the communication signals provided by the transceiver are converted into digitized data samples.

41. A micro-programmable filter engine according to claim 37, wherein the processed signals provided to the transceiver include digitized data samples.

42. A micro-programmable filter engine according to claim 37, wherein the first plurality of programmable filter elements are configurable to perform at least one of finite impulse response (FIR) filtering, infinite impulse response (IIR) filtering, echo cancellation, decimation, and interpolation on the communication signals provided by the transceiver.

43. A micro-programmable filter engine according to claim 18, wherein the first plurality of programmable filter elements are configurable to perform at least one of: finite impulse response (FIR) filtering, infinite impulse response (IIR) filtering, echo cancellation, decimation, and interpolation.

44. A micro-programmable filter engine according to claim 24, wherein the second plurality of programmable filter elements are configurable to perform at least one of: finite impulse response (FIR) filtering, infinite impulse response (IIR) filtering, echo cancellation, decimation, and interpolation.

45. A micro-programmable filter engine according to claim 18, wherein the first plurality of programmable filter elements are operably coupled to a transceiver for at least one of processing communication signals provided by the transceiver and providing processed signals to the transceiver.

46. A micro-programmable filter engine according to claim 45, wherein the transceiver is a digital subscriber line transceiver.

47. A micro-programmable filter engine according to claim 45, wherein the communication signals provided by the transceiver include digitized data samples.

48. A micro-programmable filter engine according to claim 45, wherein the communication signals provided by the transceiver are converted into digitized data samples.

49. A micro-programmable filter engine according to claim 45, wherein the processed signals provided to the transceiver include digitized data samples.

50. A micro-programmable filter engine according to claim 45, wherein the first plurality of programmable filter elements are configurable to perform at least one of finite impulse response (FIR) filtering, infinite impulse response (IIR) filtering, echo cancellation, decimation, and interpolation on the communication signals provided by the transceiver.

* * * * *